US005712504A

United States Patent [19]
Yano et al.

[11] Patent Number: 5,712,504
[45] Date of Patent: Jan. 27, 1998

[54] PIN TYPE LIGHT-RECEIVING DEVICE, OPTO ELECTRONIC CONVERSION CIRCUIT, AND OPTO-ELECTRONIC CONVERSION MODULE

[75] Inventors: Hiroshi Yano; Kentaro Doguchi; Sosaku Sawada; Takeshi Sekiguchi, all of Yokohama, Japan

[73] Assignee: Sumitomo Electric Industries, Ltd., Osaka, Japan

[21] Appl. No.: 597,448

[22] Filed: Feb. 2, 1996

[30] Foreign Application Priority Data

Feb. 2, 1995 [JP] Japan ................ 7-015997
Nov. 29, 1995 [JP] Japan ................ 7-310755

[51] Int. Cl.$^6$ .......................................... H01L 31/00
[52] U.S. Cl. ................ 257/452; 257/458; 257/466; 257/626
[58] Field of Search .................... 257/184, 452, 257/458, 466, 623, 626, 656

[56] References Cited

U.S. PATENT DOCUMENTS

5,185,272  2/1993  Makiuchi et al. ............ 257/458
5,448,099  9/1995  Yano ........................ 257/452

FOREIGN PATENT DOCUMENTS

0 503 401  9/1992  European Pat. Off. ......... 257/458

OTHER PUBLICATIONS

Andre et al, "High Optical and Electrical Quality GaInAs/InP, GaAs/InP Double Heterostructures for Optoelectronic Integration", Journl of Crystal Growth, vol. 107, Nos. 1/4, 1991, pp. 855-859.
Patent Abstracts of Japan, vol. 017, No. 178 (E-1347), Apr. 7, 1993 & JP-A-04 332178 (Sumitomo Electric Ind Ltd), Nov. 19, 1992, Hiroshi.

Sloan, "Processing and Passivation Techniques for Fabrication of High-Speed InP/InGaAs/InP Mesa Photodetectors", Hewlett-Packard Journal, vol. 40, No. 5, Oct. 1989, pp. 69-75.

Patent Abstracts of Japan, vol. 94, No. 11 & JP-A-06 314813 (Sumitomo Electric Ind Ltd), Nov. 8, 1994, Hiroshi.

Chandrasekhar et al, "An InP/InGaAs p-i-n/HBT Monolithic Transimpedance Photoreceiver", IEEE Photonics Technology Letters, vol. 2, No. 7, Jul. 1990, pp. 505-506.

(List continued on next page.)

*Primary Examiner*—Minh-Loan Tran
*Attorney, Agent, or Firm*—Cushman Darby & Cushman IP Group of Pillsbury Madison & Sutro LLP

[57] ABSTRACT

A pin type light-receiving device according to the present invention comprises (a) a semiconductor substrate, (b) a first semiconductor layer formed on a semiconductor substrate and doped with an impurity of a first conduction type, (c) a second semiconductor layer formed in a mesa shape on the first semiconductor layer and made of a first semiconductor material without intentionally doping the first semiconductor material with an impurity, (d) a third semiconductor layer formed in a mesa shape on the second semiconductor layer and made of the first semiconductor material doped with an impurity of a second conduction type different from the first conduction type, (e) a first electrode layer formed in ohmic contact on the first semiconductor layer, (f) a second electrode layer formed in ohmic contact on the third semiconductor layer, and (g) a fourth semiconductor layer formed around the first to the third semiconductor layers and made of a second semiconductor material having a band gap energy greater than the first semiconductor material without intentionally doping the second semiconductor material with an impurity. This arrangement can suppress the dark current, based on a reduction of leak current, thereby improving the device characteristics.

12 Claims, 20 Drawing Sheets

OTHER PUBLICATIONS

Yano et al, "Monolithic pin-HEMT Receiver With Internal Equaliser for Long-Wavelength Fibre Optic Communications", Electronic Letters, Mar. 1, 1990, vol. 26, No. 5, pp. 305-307.

Ohnaka et al, "A Low Dark Current InGaAs/InP p-i-n Photodiode With Covered Mesa Structure", IEEE Transactions on Electron Devices, vol. ED-34, No. 2, Feb. 1987, pp. 199-204.

Sloan "Processing and Passivation Techniques for Fabrication of High-Speed InP/InGaAs/InP Mesa Photodetectors", Hewlett Packard Journal, Oct. 1989, pp. 69-75.

Carey et al, "Leakage Current in GaInAs/InP Photodiodes Grown by Omvpe", Journal of Crystal Growth 98, (1989), North-Holland, Amsterdam, pp. 90-97.

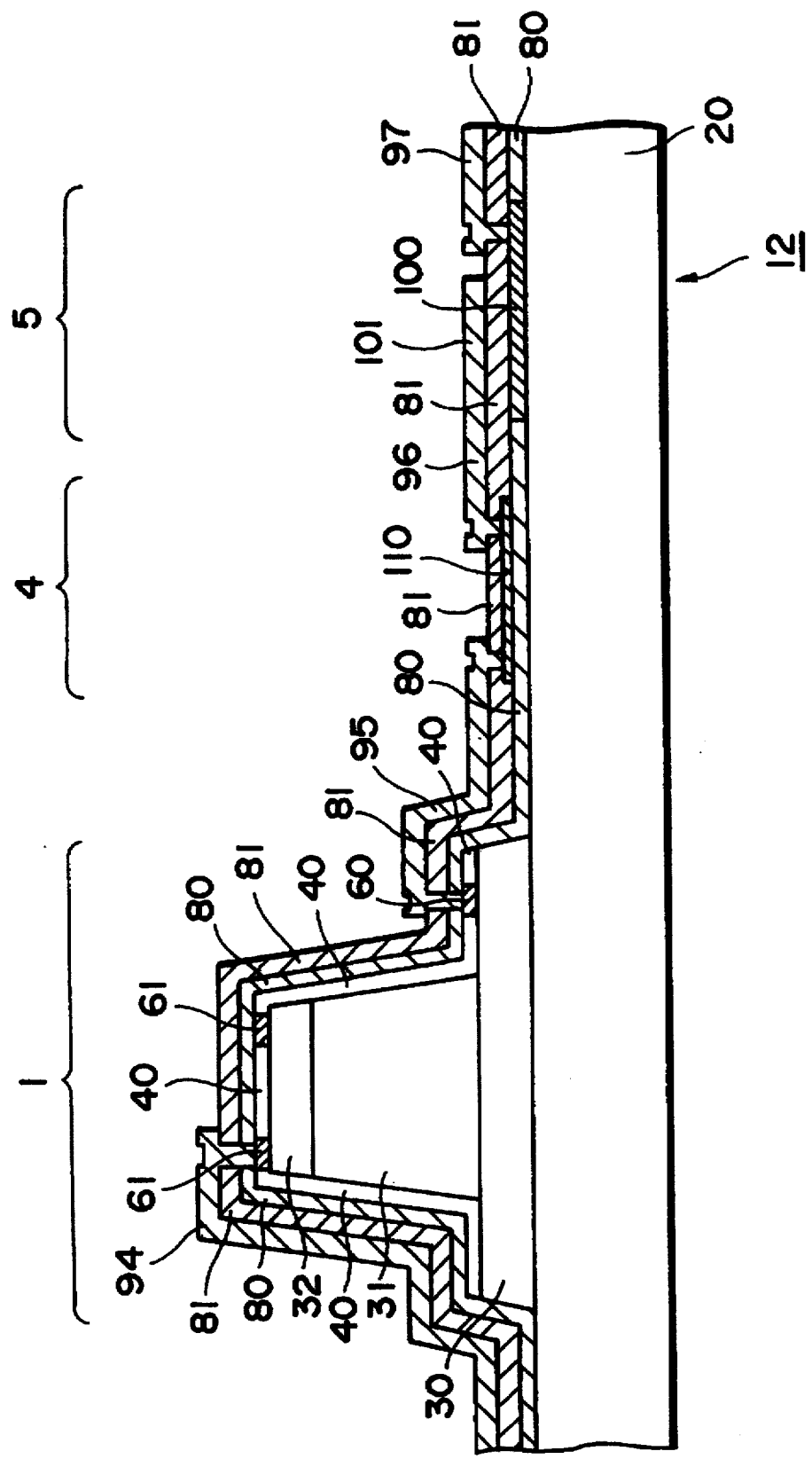

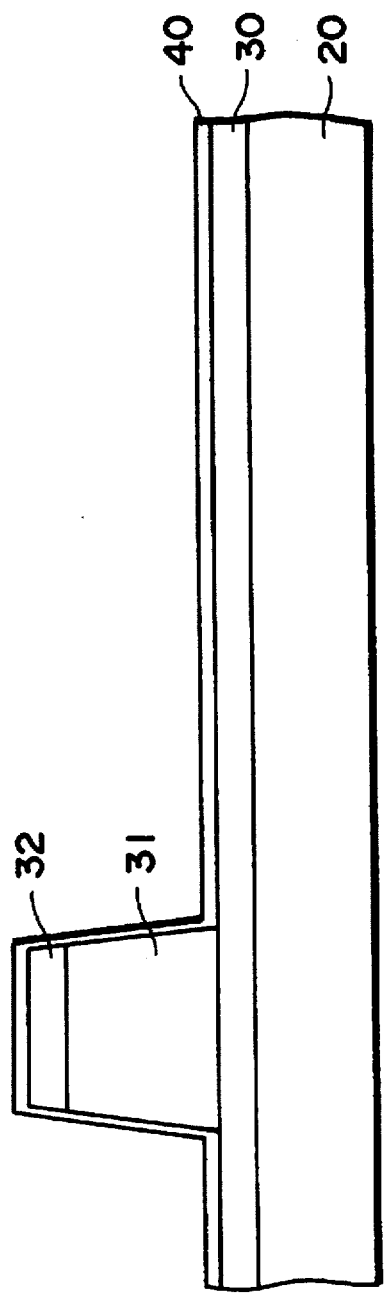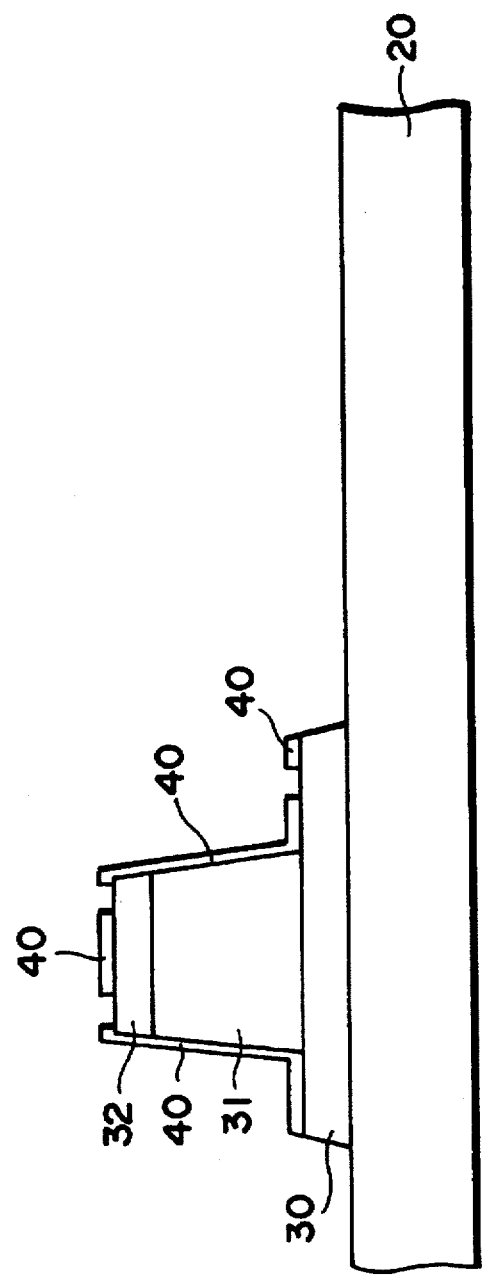
Fig. 10A
Fig. 10B

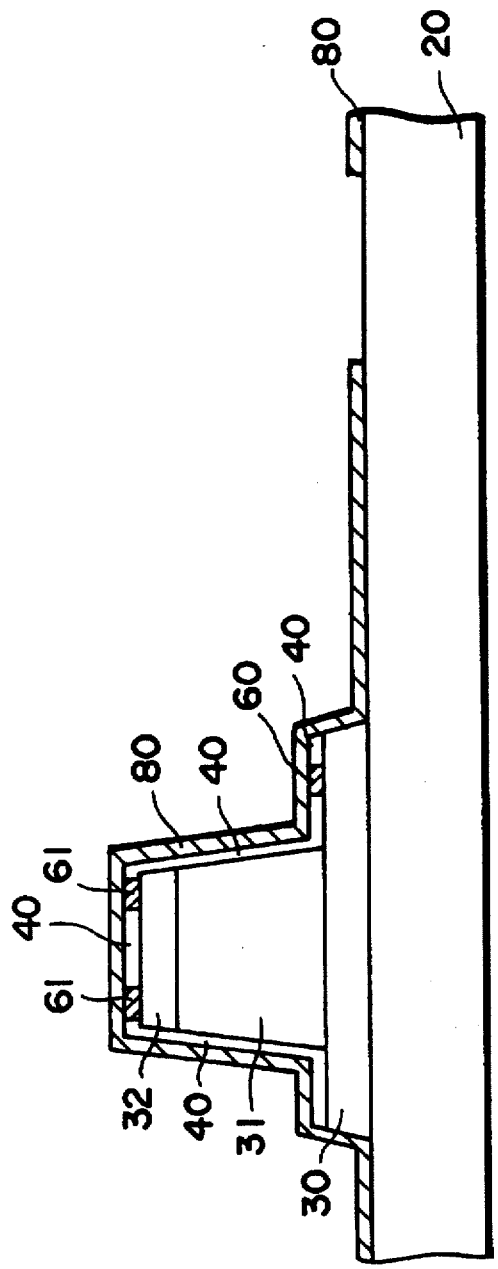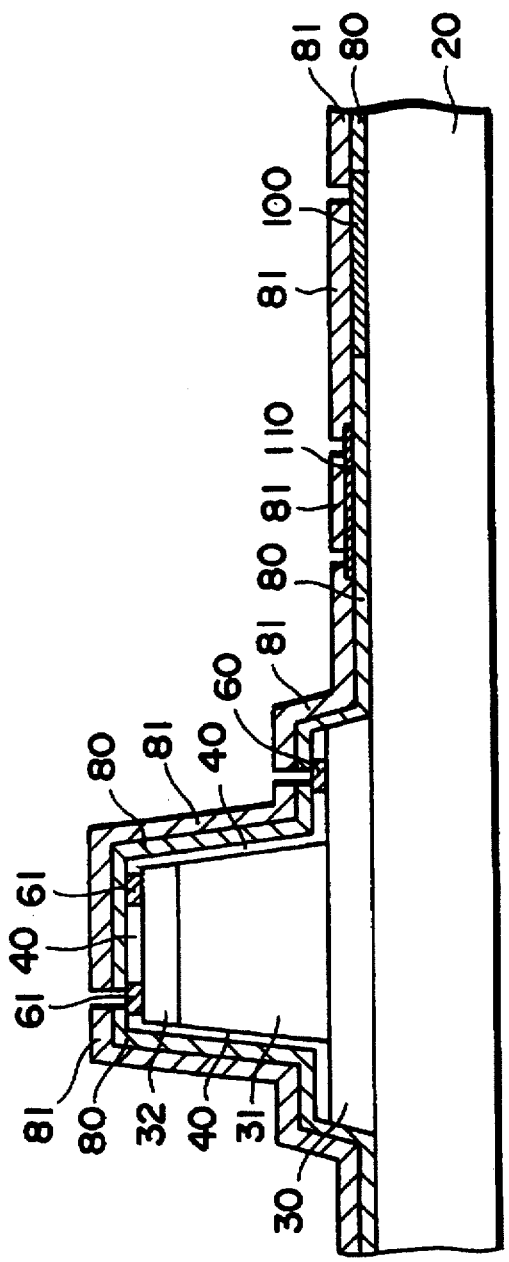

PIN TYPE LIGHT-RECEIVING DEVICE, OPTO ELECTRONIC CONVERSION CIRCUIT, AND OPTO-ELECTRONIC CONVERSION MODULE

BACKGROUND OF THE INVENTION

1. Field of the Invention

The present invention relates to a pin type light-receiving device used in an optical information transmission system and a fabrication process thereof, to a photoelectronic (opto-electronic) conversion circuit in which the pin type light-receiving device and a variety of electronic devices are monolithically integrated on the same substrate, and a fabrication process thereof, and further to an opto-electronic conversion module packaging the opto-electronic conversion circuit. More particularly, the present invention concerns the pin type light-receiving device, opto-electronic conversion circuit, and opto-electronic conversion module suitably applicable to an optical fiber communication system requiring particularly high reliability, and fabrication processes thereof.

2. Related Background Art

Generally, an opto-electronic integrated circuit includes a light-receiving device such as a pin type photodiode (pin-PD, p-i-n PD) or an avalanche photodiode (APD) and an electronic device such as a heterojunction bipolar transistor (HBT) or a field effect transistor (FET), as monolithically integrated on the same substrate. Particularly, the pin type light-receiving device is formed mainly in a mesa shape because of its easiness of integration and easiness of electric insulation between devices.

The following references describe in detail the prior art concerning the opto-electronic integrated circuits in which the mesa pin type light-receiving device as described is integrated.

"IEEE Photonics Technology Letters, vol. 2, no. 7, pp. 505-506, 1990"

"Electronic Letters, vol 26, no. 5, pp. 305-307, 1990"

In the mesa pin type light-receiving devices developed heretofore, a depletion layer made upon application of a reverse bias voltage is exposed on the wall surface of a semiconductor layer formed in the mesa shape. This causes a leak current to flow along the wall surface of the semiconductor layer, depending upon the surface state of a passivation film covering the semiconductor layer. Attempts have been made to develop various countermeasures to decrease the leak current.

For example, a first semiconductor layer of $n^-$ type and a second semiconductor layer of $n^-$ type are successively laminated on a semiconductor substrate of $n^+$ type, the second semiconductor layer is etched in the mesa shape, and then an impurity is diffused to dope surface regions of the first and second semiconductor layers. In the planar pin type light-receiving device of this kind, the depletion layer extending from the inside of the first and second semiconductor layers is not exposed on the surfaces of the first and second semiconductor layers.

In another example, a buffer layer of i type, a first semiconductor layer of i type, and a second semiconductor layer of p type are successively laminated on a semiconductor substrate of $n^+$ type, the buffer layer and the first and second semiconductor layers are etched in the mesa shape, and thereafter a passivation film of $n^-$ type is formed around the semiconductor substrate, buffer layer, and first and second semiconductor layers so as to cover them. In the mesa pin type light-receiving device of this kind, the depletion layer extending between the first and second semiconductor layers is not exposed on the surfaces of the buffer layer and the first and second semiconductor layers.

In a further case, a buffer layer of i type and a semiconductor layer of i type are successively laminated on a semiconductor substrate of $n^+$ type, the buffer layer and semiconductor layer are etched in the mesa shape, and thereafter a passivation film of p type is formed around the semiconductor substrate, buffer layer, and semiconductor layer so as to cover them. In the mesa pin type light-receiving device of this kind, the depletion layer extending between the semiconductor layer and the passivation film is not exposed on the surfaces of the buffer layer and semiconductor layer.

The following references describe in detail the prior art concerning the reduction of dark current in the mesa pin type light-receiving devices as described.

"IEEE Transactions on Electron Devices, vol. ED-34, no. 2, pp. 199-204, 1987"

"Hewlett-Packard Journal, vol. 40, pp. 69-75, October 1989"

SUMMARY OF THE INVENTION

A first object of the present invention is to provide a pin type light-receiving device improved in device characteristics by suppressing the dark current, based on a reduction of the leak current, and a fabrication process thereof. A second object of the invention is to provide an opto-electronic conversion circuit improved in receiving sensitivity by integration of the above pin type light-receiving device with a variety of electronic devices, and a fabrication process thereof. A third object of the invention is to provide an opto-electronic conversion module improved in receiving sensitivity by packaging the above opto-electronic conversion circuit.

In order to achieve the above object, a pin type light-receiving device of the present invention comprises (a) a semiconductor substrate, (b) a first semiconductor layer formed on the semiconductor substrate and doped with an impurity of a first conduction type, (c) a second semiconductor layer formed in a mesa shape on the first semiconductor layer and made of a first semiconductor material without intentionally doping the first semiconductor material with an impurity, (d) a third semiconductor layer formed in a mesa shape on the second semiconductor layer and made of the first semiconductor material doped with an impurity of a second conduction type different from the first conduction type, (e) a first electrode layer formed in ohmic contact on the first semiconductor layer, (f) a second electrode layer formed in ohmic contact on the third semiconductor layer, and (g) a fourth semiconductor layer formed around the first to third semiconductor layers and made of a second semiconductor material having a band gap energy greater than that of the first semiconductor material without intentionally doping the second semiconductor material with an impurity.

In the above pin type light-receiving device, the fourth semiconductor layer, made without intentionally doping the second semiconductor material having the greater band gap energy than that of the first semiconductor material forming the second and third semiconductor layers with an impurity, is formed around the first to third semiconductor layers. In this arrangement, the interface of a pn junction region between the first semiconductor layer and the third semiconductor layer thus becomes a heterojunction to the so-called wide band gap semiconductor layer.

Because of it, with application of a reverse bias voltage the depletion layer made between the first semiconductor layer and the third semiconductor layer does not reach the interface between the fourth semiconductor layer and an insulator layer covering the surface thereof, and thus is not exposed. This results in decreasing the leak current flowing along the wall surfaces of the second and third semiconductor layers depending upon the surface state between the fourth semiconductor layer and the insulator layer.

Here, it is preferred in the pin type light-receiving device of the present invention that the interfacial region of the fourth semiconductor layer in contact with the third semiconductor layer is made with doping the second semiconductor material with the impurity of the second conduction type.

In such a pin type light-receiving device, the interface of the pn junction region between the first semiconductor layer and the third semiconductor layer becomes a homojunction in the wide band gap semiconductor layer near the heterojunction region between the fourth semiconductor layer and the third semiconductor layer. This further reduces the leak current flowing along the wall surfaces of the second and third semiconductor layers.

In the pin type light-receiving device of the present invention, it is more desired that the first semiconductor material is GaInAs and the second semiconductor material is InP.

It is more desired in the pin type light-receiving device of the present invention that the device further comprise an insulator layer formed around the semiconductor substrate and the first to fourth semiconductor layers.

It is more desired in the pin type light-receiving device of the present invention that the first conduction type is the n type and the second conduction type is the p type.

Next, in order to achieve the above object, a fabrication process of the pin type light-receiving device of the present invention comprises (a) a first phase of successively laminating a first semiconductor layer doped with an impurity of a first conduction type, a second semiconductor layer made of a first semiconductor material without intentionally doping the first semiconductor material with an impurity, and a third semiconductor layer made of the first semiconductor material doped with an impurity of a second conduction type different from the first conduction type on a semiconductor substrate to form the layers thereon, (b) a second phase of removing peripheral regions of the second and third semiconductor layers formed in the first phase to process the second and third semiconductor layers each in a mesa shape, (c) a third phase of forming a fourth semiconductor layer made of a second semiconductor material having a band gap energy greater than that of the first semiconductor material without intentionally doping the second semiconductor material with an impurity, around the second and third semiconductor layers processed in the mesa shape in the second phase and the first semiconductor layer, and (d) a fourth phase of removing predetermined regions of the fourth semiconductor layer formed in the third phase to expose predetermined regions of the first and third semiconductor layers, thereafter forming a first electrode layer in ohmic contact on the first semiconductor layer, and forming a second electrode layer in ohmic contact on the third semiconductor layer.

In the fabrication process of the pin type light-receiving device as described, the fourth semiconductor layer made of the second semiconductor material having the band gap energy greater than that of the first semiconductor material is formed around the second and third semiconductor layers both made of the first semiconductor material. This results in forming the fourth semiconductor layer as a so-called wide band gap semiconductor layer on the second and third semiconductor layers made of the same semiconductor material.

Therefore, the second semiconductor material forming the fourth semiconductor layer is epitaxially grown as maintaining lattice constant matched to the first semiconductor material forming the second and third semiconductor layers, so that it can be formed in relatively good crystal quality. The location of the pn junction region between the first semiconductor layer and the third semiconductor layer is determined based only on the steps for forming the first to third semiconductor layers, because it is independent of the step for forming the fourth semiconductor layer.

Here, it is preferred in the fabrication process of the pin type light-receiving device according to the present invention that the third phase comprise a heating treatment for diffusing the impurity of the second conduction type from the third semiconductor layer into the interfacial region of the fourth semiconductor layer in contact with the third semiconductor layer to dope the interfacial region with the impurity.

In the production process of the pin type light-receiving device as described, the interface of the pn junction region between the first semiconductor layer and the third semiconductor layer becomes a homojunction inside the wide band gap semiconductor near the heterojunction region between the fourth semiconductor layer and the third semiconductor layer.

It is more preferred in the fabrication process of the pin type light-receiving device according to the present invention that the heat treatment is carried out based on heat applied when the fourth semiconductor layer is grown around the third semiconductor layer.

It is more preferred in the fabrication process of the pin type light-receiving device according to the present invention that the heat treatment be carried out based on heat applied to an atmosphere around the semiconductor substrate and the first to fourth semiconductor layers.

The fabrication process of the pin type light-receiving device according to the present invention is more preferably arranged to further comprise a fifth phase, subsequent to the fourth phase, of washing the surfaces of the first to fourth semiconductor layers by immersing peripheral regions of the first to fourth semiconductor layers in a washing solution which substantially reacts with only impurities existing in surfaces of the first and second semiconductor materials, and a sixth phase of forming an insulator layer around the first to fourth semiconductor layers and the semiconductor substrate surface-treated in the fifth phase.

In the fabrication process of the pin type light-receiving device as described above, it is effected to remove oxide films, various impurities, etc. present in the surfaces of the first to fourth semiconductor layers.

In the fabrication process of the pin type light-receiving device according to the present invention, it is more desired that the washing solution contain either HCl or HF.

Next, in order to achieve the above object, an optoelectronic conversion circuit of the present invention comprises (a) the pin type light-receiving device of the present invention, and (b) an electronic device formed on the semiconductor substrate as monolithically integrated with the pin type light-receiving device and electrically connected to the pin type light-receiving device.

In the above opto-electronic conversion circuit the electronic device is monolithically integrated with the pin type light-receiving device of the present invention on the semiconductor substrate. Thus, the leak current is decreased in the pin type light-receiving device, which decreases noise in the circuit.

A preferred form of the opto-electronic conversion circuit of the present invention comprises a plurality of pin type light-receiving devices monolithically integrated on the semiconductor substrate and electrically connected with each other, thus composing a light-receiving device array.

In the opto-electronic conversion circuit of this type, leak currents are decreased in the individual pin type light-receiving devices, resulting in decreasing the leak current in the entire light-receiving device array.

It is more preferred in the opto-electronic conversion circuit of the present invention that the electronic circuit device be a heterojunction bipolar transistor.

It is more desired in the opto-electronic conversion circuit of the present invention that the electronic circuit device is comprised of a capacitor formed directly on the semiconductor substrate and a resistor formed through an insulator layer on the semiconductor substrate.

It is more desired in the opto-electronic conversion circuit of the present invention that the capacitor is an equivalent capacitance capacitor having a capacitance value identical to that of the pin type light-receiving device.

Next, in order to achieve the above object, a fabrication process of the opto-electronic conversion circuit of the present invention comprises (a) a first step of carrying out the production process of the pin type light-receiving device according to the present invention, and (b) a second step of forming an electronic device as monolithically integrated with the pin type light-receiving device formed in the first step on the semiconductor substrate and electrically connecting the pin type light-receiving device with the electronic device.

In the fabrication process of the opto-electronic conversion circuit as described above, the electronic device is formed as monolithically integrated with the pin type light-receiving device formed by the fabrication process of the pin type light-receiving device according to the present invention on the semiconductor substrate. Thus, the fourth semiconductor layer is formed in relatively good crystal quality in the pin type light-receiving device, and the location of the pn junction region depends upon only the steps for forming the first to third semiconductor layers.

Here, it is preferred in the fabrication process of the opto-electronic conversion circuit of the present invention that the second step comprise a heating treatment for diffusing the impurity having the second conduction type from the third semiconductor layer into the interfacial region of the fourth semiconductor layer in contact with the third semiconductor layer, based on heat applied in forming the electronic device on the fourth semiconductor layer, to dope the interfacial region therewith.

In the fabrication process of the opto-electronic conversion circuit as described above, the interface of the pn junction region between the first semiconductor layer and the third semiconductor layer becomes a homojunction inside the wide band gap semiconductor near the heterojunction region between the fourth semiconductor layer and the third semiconductor layer.

Next, in order to attain the above-mentioned object, an opto-electronic conversion module in accordance with the present invention comprises (a) a conductive substrate, (b) the opto-electronic conversion circuit of the present invention disposed on the conductive substrate, (c) a first preamplifier which is disposed on the conductive substrate and electrically connected to a pin type light-receiving device of the opto-electronic conversion circuit, and (d) a second amplifier which has a configuration identical to that of the first preamplifier and is disposed on the conductive substrate while being electrically connected to an electronic circuit device of the opto-electronic conversion circuit. This electronic circuit device comprises (i) an equivalent capacitance capacitor which is directly formed on a semiconductor substrate and has a capacitance value identical to that of the pin type light-receiving device and (ii) a resistor formed on the semiconductor substrate by way of an insulator layer.

In such an opto-electronic conversion module, the opto-electronic conversion circuit of the present invention, in which, together with pin type light-receiving device, the equivalent capacitor and resistor, as the electronic circuit device, are monolithically integrated on the semiconductor substrate, and the first and second amplifiers electrically connected to the opto-electronic conversion circuit are packaged on the conductive substrate.

Accordingly, leak current at the pin type light-receiving device is reduced, thereby decreasing noise generated at the first and second preamplifiers. Therefore, an opto-electronically-converted signal output from the first preamplifier and a noisecompensating signal output from the second preamplifier can be used for eliminating the common mode noise generated due to fluctuations in environmental temperature and bias power supply, for example.

Here, it is preferable for the opto-electronic conversion module of the present invention to further comprise a capacitor for bypassing high frequency component of the bias which is formed on the conductive substrate and electrically connected to the resistor so as to constitute a bias circuit for the pin type light-receiving device.

In such an opto-electronic conversion module, since the bias circuit for the pin type light-receiving device is constituted as a low-pass RC filter by the resistor and the bypassing capacitor, the noise generated by fluctuations in the bias power supply in the pin type light-receiving device can be reduced.

More preferably, in the opto-electronic module of the present invention, a die cap constituting the bypassing capacitor is disposed close to the chip which monolithically constitutes the first and second preamplifiers, and the opto-electronic conversion circuit is mounted thereon.

In the opto-electronic conversion module of the present invention, the conductive substrate is preferably formed with TO 18 configuration in TO package standard.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent/ to those skilled in the art from this detailed description.

BRIEF DESCRIPTION OF THE DRAWINGS

FIG. 9 is a sectional view to show the structure of the opto-electronic conversion integrated circuit according to the fifth embodiment of the present invention;

FIGS. 10A and 10B are sectional views to sequentially show fabrication steps of the opto-electronic conversion circuit of FIG. 9;

FIGS. 11A and 11B are sectional views to sequentially show fabrication steps of the opto-electronic conversion circuit of FIG. 9;

DESCRIPTION OF THE PREFERRED EMBODIMENTS

Figure 1:
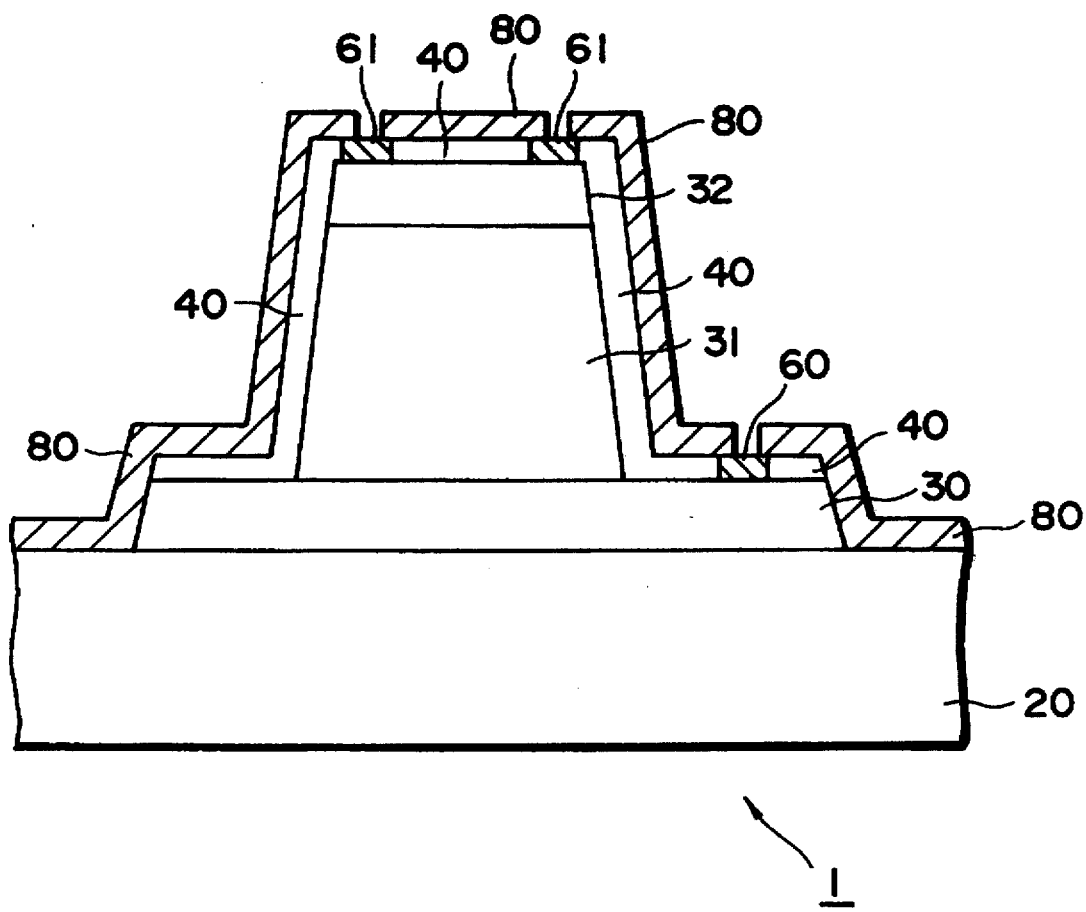
FIG. 1 is a sectional view to show the structure of the pin type light-receiving device according to the first embodiment of the present invention.

The constitution and operation will be explained in detail for the various embodiments of the present invention with reference to FIG. 1 to FIG. 18. In the description of the drawings same elements will be denoted by same reference numerals and redundant description will be omitted. It is noted that the dimensional scales of the drawings do not always coincide with those in the description.

First Embodiment

As shown in FIG. 1, a pin-PD 1 as a pin type light-receiving device is formed by successively laminating an n type semiconductor layer 30, an i type semiconductor layer 31, and a type semiconductor layer 32 as the first to third semiconductor layers on a semiconductor substrate 20. The i type semiconductor layer 31 and p type semiconductor layer 32 are formed each in a mesa shape, integrally forming a first mesa portion in a frustum of circular cone. The n type semiconductor layer 30 is formed in a mesa shape, thus singly composing a second mesa portion in a frustum of circular cone located under the bottom surface of the first mesa portion.

On the top surface of the second mesa portion an n type electrode layer 60 is formed in a predetermined pattern as the first electrode layer in ohmic contact with the n type semiconductor layer 30. On the top surface of the first mesa portion a p type electrode layer 61 is formed in a predetermined pattern as the second electrode layer in ohmic contact with the p type semiconductor layer 32. A passivation semiconductor layer 40 is formed as the fourth semiconductor layer on the top surface and side wall of the first mesa portion and on the top surface of the second mesa portion, i.e., around the p type semiconductor layer 32, i type semiconductor layer 31, and n type semiconductor layer 30.

Further, a first passivation insulator layer 80 is formed as the insulator layer so as to cover the surface of the semiconductor substrate 20, the side wall of the n type semiconductor layer 30, and the surface of the passivation semiconductor layer 40. Here, the first passivation insulator layer 80 has apertures each on the surfaces of the n type electrode layer 60 and p type electrode layer 61.

The semiconductor substrate 20 is made of semi-insulating InP doped with Fe in the concentration of about 0.7 to 0.8 wt ppm. The n type semiconductor layer 30 is made of n type InP doped with Si as the impurity of the first conduction type in the concentration of about $5 \times 10^{18}$ cm$^{-3}$ and has the film thickness of about 300 nm. Using GaInAs as the first semiconductor material, the i type semiconductor layer 31 is made of high-resistive GaInAs without intentionally doping it with an impurity, that is, of i type GaInAs, and has the film thickness of about 2.0 pm. However, the i type semiconductor layer 31 is generally made of n⁻ type GaInAs substantially having the first conduction type because of the impurity contained in a relatively low concentration. Using GaInAs as the first semiconductor material, the p type semiconductor layer 32 is made of p type GaInAs doped with Zn as the impurity of the second conduction type different from the first conduction type in the concentration of about $1 \times 10^{19}$ cm$^{-3}$ and has the film thickness of about 300 nm.

Using InP as the second semiconductor material having the band gap energy greater than that of the first semiconductor material, the passivation semiconductor layer 40 is made of high-resistive or i type InP without intentionally doping it with an impurity, and has the film thickness of about 10 to 500 nm. The n type electrode layer 60 is made of AuGe/Ni, in which the AuGe layer and Ni layer have the film thicknesses of about 100 nm and about 30 nm, respectively. The p type electrode layer 61 is made of Ti/Pt/Au, in which the Ti layer, Pt layer, and Au layer have the film thicknesses of about 20 nm, about 40 nm, and about 100 nm, respectively. The first passivation insulator layer 80 is made of SiN and has the film thickness of about 100 to 200 nm.

Here, the i type semiconductor layer 31 and the p type semiconductor layer 32 both are made of GaInAs having the band gap energy of about 0.75 eV as the first semiconductor material, but they have the mutually different conduction types. The passivation semiconductor layer 40 is made of InP having the band gap energy of about 1.35 eV as the second semiconductor material having the band gap energy greater than that of the first semiconductor material forming the i type semiconductor layer 31 and the p type semiconductor layer 32, thus having high resistivity.

Next explained are fabrication steps of pin-PD 1.

Figure 2A:
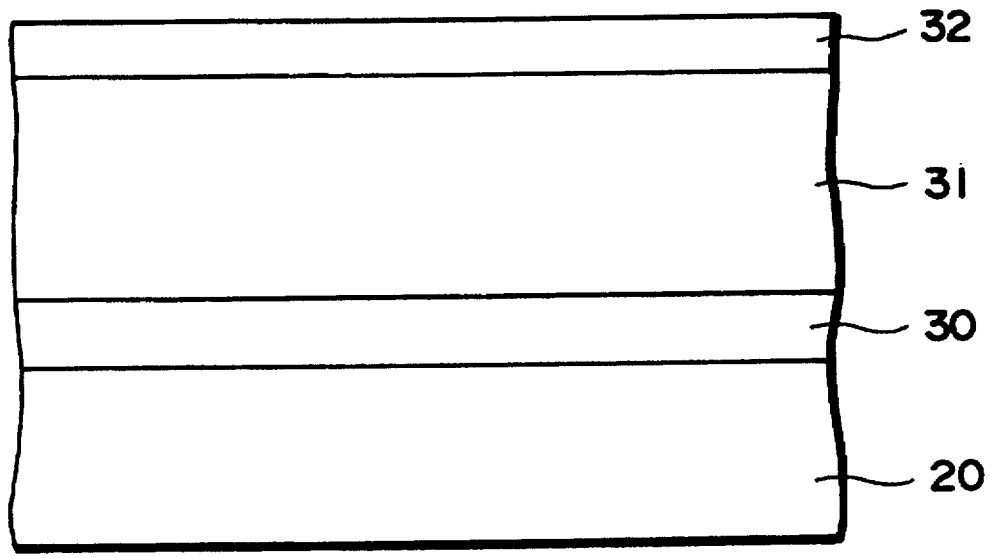
FIGS. 2A and 2B are sectional views to sequentially show fabrication steps of the pin type light-receiving device of FIG. 1.

First, as shown in FIG. 2A, the n type semiconductor layer 30, i type semiconductor layer 31, and p type semiconductor layer 32 are formed as successively laminated on the surface of the semiconductor substrate 20 by the ordinary organo metallic vapor phase epitaxy (OMVPE) process.

Figure 2B:
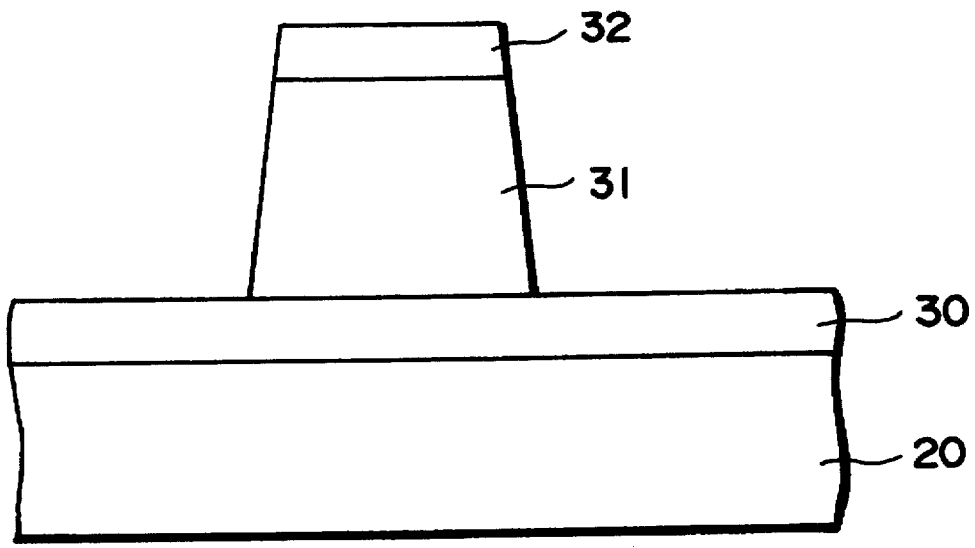

Subsequently, as shown in FIG. 2B, a first mask is formed in a circular pattern in the region where the first mesa portion is to be formed in the p type semiconductor layer 32, based on the ordinary photolithography technology. Then the peripheral region of the p type semiconductor layer 32 exposed from the first mask is removed by a phosphoric acid ($H_3PO_4$) based etchant by the ordinary wet etching process. Thus, the p type semiconductor layer 32 and i type semiconductor layer 31 are successively processed in the mesa shape, thus forming the first mesa portion.

Figure 3A:
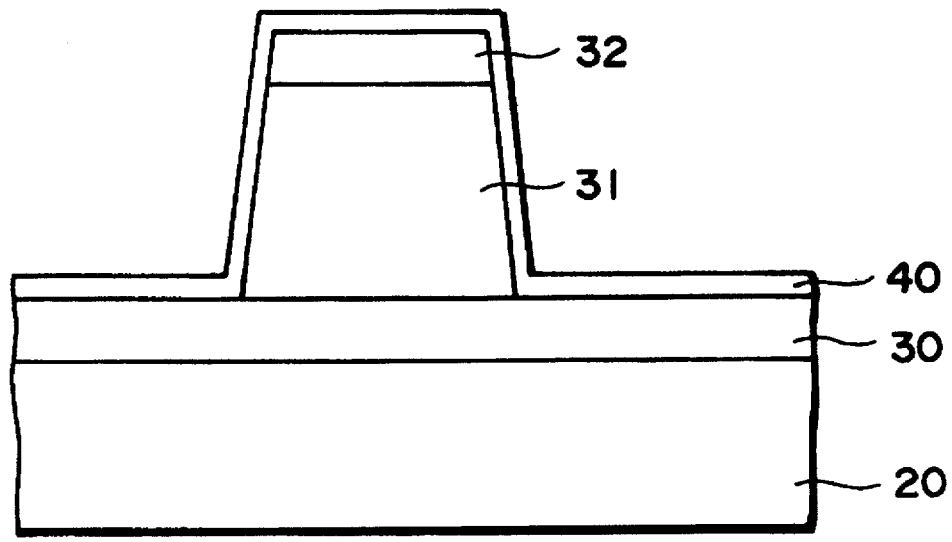
FIGS. 3A and 3B are sectional views to sequentially show fabrication steps of the pin type light-receiving device of FIG. 1.

Next, as shown in FIG. 3A, the passivation semiconductor layer 40 is formed on the surfaces of the p type semiconductor layer 32, i type semiconductor layer 31, and n type semiconductor layer 30, that is, at least around the first mesa portion by the ordinary OMVPE process.

Since the p type semiconductor layer 32 and i type semiconductor layer 31 are made of the same semiconductor material of GaInAs, it is easy to take a step to prevent elements from evaporating out of the material forming the p type semiconductor layer 32 and i type semiconductor layer 31. Namely, evaporation of GaInAs can be prevented by controlling the partial pressure of As in the reaction gas. Thus, epitaxial growth of the passivation semiconductor layer 40 becomes better and easier around these p type semiconductor layer 32 and i type semiconductor layer 31.

If the p type semiconductor layer 32 and i type semiconductor layer 31 were made of mutually different semiconductor materials, for example supposing there should exist plural semiconductor materials of GaInAs and InP, the step taken for preventing elements from evaporating these materials forming the layers would become complicated. Namely, balanced control becomes necessary between the partial pressure of As and the partial pressure of P in the reaction gas in order to prevent GaInAs and InP each from evaporating. This makes good epitaxial growth of the passivation semiconductor layer 40 difficult around these p type semiconductor layer 32 and i type semiconductor layer 31, and it is, therefore, desired to make the p type semiconductor layer 32 and i type semiconductor layer 31 of the same semiconductor material.

Figure 3B:
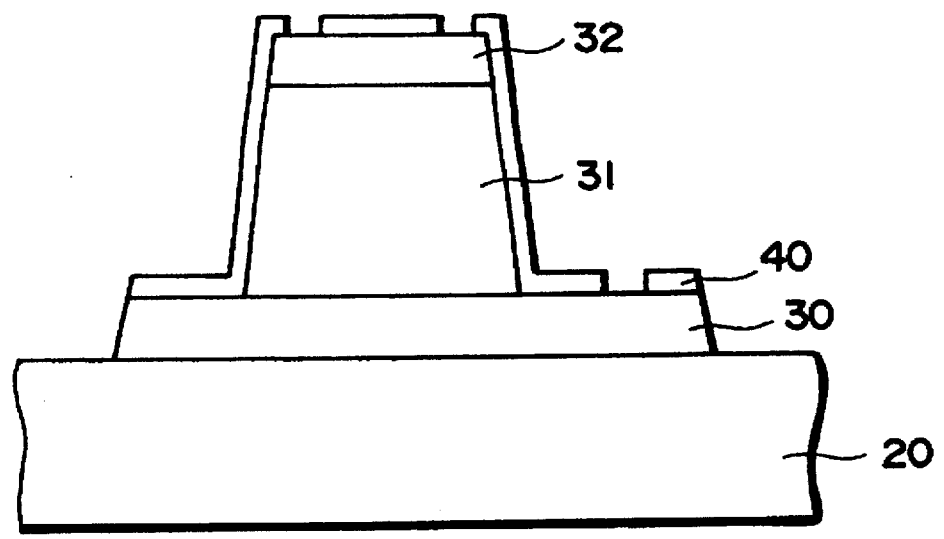

Subsequently, as shown in FIG. 3B, a second mask is formed in a circular pattern on the region where the second mesa portion is to be formed in the passivation semiconductor layer 40, based on the ordinary photolithography technology. Then the peripheral area of the passivation semiconductor layer 40 exposed from the second mask is removed by a hydrochloric acid (HCl) based etchant by the ordinary wet etching process. Thus, the passivation semiconductor layer 40 and the n type semiconductor layer 30 are successively processed in the mesa shape, thus forming the second mesa portion.

After that, a third mask is formed in predetermined patterns on the surface of the passivation semiconductor layer 40 in the same manner, and the inside regions of the passivation semiconductor layer 40 exposed from the third mask are removed. Thus, the predetermined regions of the n type semiconductor layer 30 and the p type semiconductor layer 32 are exposed as the region for forming the n type electrode layer and the region for forming the p type electrode layer, respectively.

Subsequently, as shown in FIG. 1, the n type electrode layer 60 and p type electrode layer 61 are formed in the predetermined regions exposed in the n type semiconductor layer 30 and the p type semiconductor layer 32, respectively, based on the ordinary vacuum vapor deposition process.

After that, based on the ordinary wet etching process, the peripheral regions of the n type semiconductor layer 30, i type semiconductor layer 31, p type semiconductor layer 32, and passivation semiconductor layer 40 are immersed in a washing solution of either a hydrochloric acid (HCl) based solution or a hydrofluoric acid (HF) based solution. Thus, the exposed surfaces of the n type semiconductor layer 30, i type semiconductor layer 31, p type semiconductor layer 32, and passivation semiconductor layer 40 are washed as removing oxide films, various impurities, etc.

A desired washing solution for such surface treatment is one which rarely etches the semiconductor materials forming the n type semiconductor layer 30, i type semiconductor layer 31, p type semiconductor layer 32, and passivation semiconductor layer 40 as reacting with them at very low etching rate, but which substantially reacts with only the oxide films, various impurities, etc. existing on the surfaces of these semiconductor materials.

If the washing solution were one reacting with the semiconductor materials forming the n type semiconductor layer 30, i type semiconductor layer 31, p type semiconductor layer 32, and passivation semiconductor layer 40 at relatively high etching rate, it would cause a trouble of greatly deforming the shapes of the first and second mesa portions.

Then the first passivation insulator layer 80 is formed on the exposed surfaces of the semiconductor substrate 20, n type semiconductor layer 30, i type semiconductor layer 31, p type semiconductor layer 32, and passivation semiconductor layer 40 by the ordinary plasma chemical vapor deposition (CVD) process.

Further, a fourth mask is formed in predetermined patterns on the surface of the first passivation insulator layer 80 by the ordinary photolithography technology, and the inside areas of the first passivation insulator layer 80 exposing from the fourth mask are removed. Thus, the surfaces of the n type electrode layer 60 and p type electrode layer 61 are exposed as regions for forming various wiring layers therein.

In the fabrication steps as described, the passivation semiconductor layer 40 made of InP, which is the second semiconductor material having the band gap energy greater than that of the first semiconductor material, is formed around the i type semiconductor layer 31 and p type semiconductor layer 32 both made of GaInAs of the first semiconductor material. This results in forming the passivation semiconductor layer 40 as a wide band gap semiconductor layer on the surfaces of the i type semiconductor layer 31 and p type semiconductor layer 32 made of the same semiconductor material.

Because of it, the second semiconductor material forming the passivation semiconductor layer 40 is epitaxially grown as maintaining the lattice constant matched to the first semiconductor material forming the i type semiconductor layer 31 and p type semiconductor layer 32, so that it is formed in relatively good crystal quality. Further, the location of the pn junction region between the n type semiconductor layer 30 and the p type semiconductor layer 32 is determined based only on the steps for forming the n type semiconductor layer 30, i type semiconductor layer 31, and p type semiconductor layer 32, independent of the step for forming the passivation semiconductor layer 40. Accordingly, the pn junction region can perfectly be covered with the passivation semiconductor layer 40.

When pin-PD 1 is connected by wire bonding to a package, a device, or IC (Integrated Circuits) not shown, bonding pads electrically connected with pin-PD 1 are naturally formed outside the pin-PD 1, and thus, pin-PD 1 is subject to reduced chances of mechanical damage when connected by wire bonding. Thus, the packaging yield of pin-PD 1 is improved thereby.

Since the bonding pads electrically connected to the pin-PD 1 are formed outside the pin-PD 1, the conditions of forming the wire bonding are expanded, which can reduce degradation of high-frequency characteristics caused depending upon the wire length and the pad area.

Next explained is the operation of pin-PD 1.

In the pin-PD 1, the passivation semiconductor layer 40 is made of InP without intentionally doping it with an impurity as the second semiconductor material having the band gap energy greater than that of GaInAs of the first semiconductor material forming the i type semiconductor layer 31 and p type semiconductor layer 32, and is formed around the n type semiconductor layer 30, i type semiconductor layer 31, and p type semiconductor layer 32. By this, the interface of the pn junction region between the n type semiconductor layer 30 and the p type semiconductor layer 32 becomes a heterojunction to the passivation semiconductor layer 40.

Because of it, with application of the reverse bias voltage the depletion layer formed between the n type semiconductor layer 30 and the p type semiconductor layer 32 does not reach the interface between the passivation semiconductor layer 40 and the first passivation insulator layer 80 covering the surface thereof, and thus, is not exposed. Therefore, this reduces the leak current flowing along the wall surfaces of the i type semiconductor layer 31 and p type semiconductor layer 32 depending upon the surface state between the passivation semiconductor layer 40 and the first passivation insulator layer 80, which can improve the device characteristics based on suppression of dark current.

Second Embodiment

Figure 4:
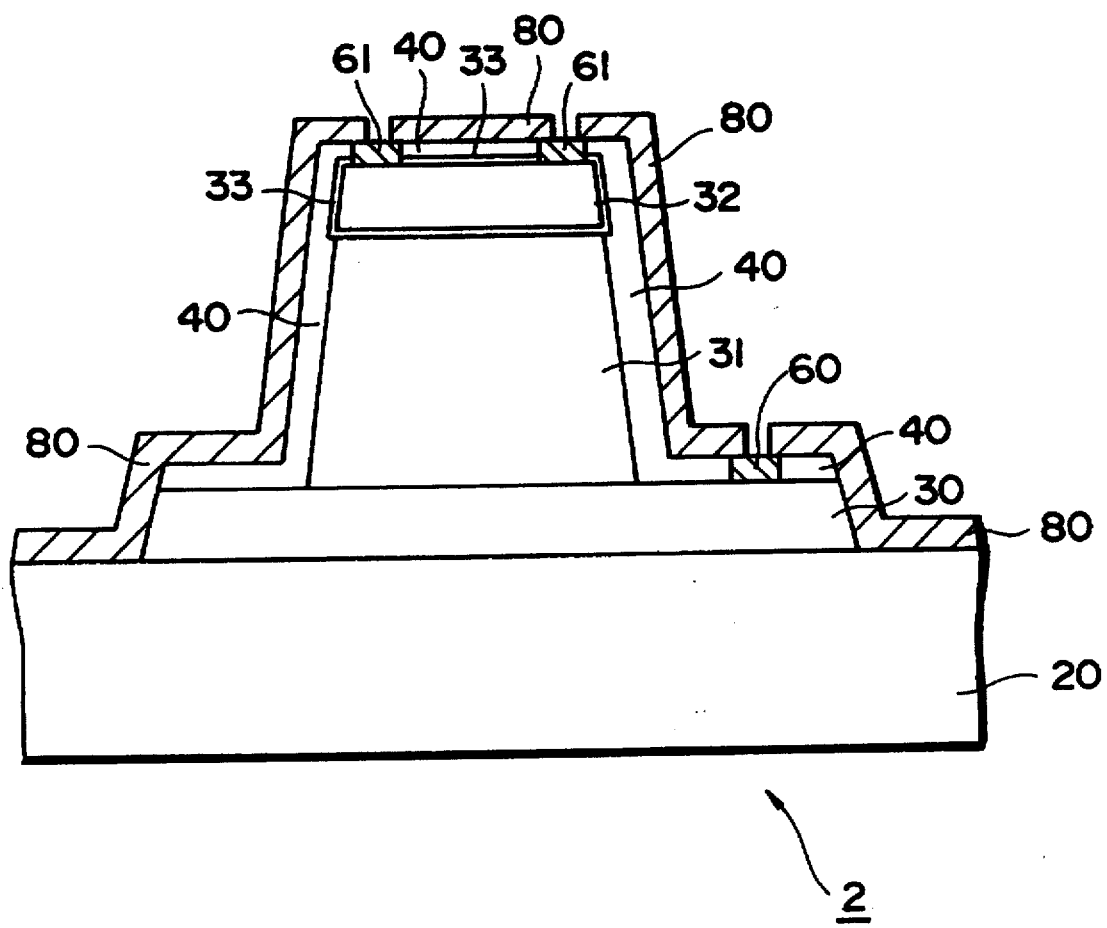
FIG. 4 is a sectional view to show the structure of the pin type light-receiving device according to the second embodiment of the present invention.

As shown in FIG. 4, a pin-PD 2 as a pin type light-receiving device is constructed substantially in the same manner as the pin-PD 1 in the first embodiment except that an impurity-diffusing region 33 is formed in interfacial regions of the passivation layer 40 and i type semiconductor layer 31 in contact with the p type semiconductor layer 32 in pin-PD 2. The impurity-diffusing region 33 is made of type InP doped with Zn as the impurity of the second conduction type different from the first conduction type in the concentration of about $1\times10^{18}$ to $1\times10^{19}$ cm$^{-3}$ and has the film thickness of about 5 to 50 nm.

Next explained are fabrication steps of the pin-PD 2.

This pin-PD 2 is fabricated almost in the same manner as the pin-PD 1 of the above first embodiment. However, based on heat applied in growing the passivation semiconductor layer 40 on the surface of the p type semiconductor layer 32, Zn as the impurity of the second conduction type is diffused from the p type semiconductor layer 32 into the interfacial regions of the passivation layer 40 and i type semiconductor layer 31 in contact with the p type semiconductor layer 32 to dope the interfacial regions therewith. This forms the impurity-diffusing region 33 in the interfacial regions of the passivation layer 40 and i type semiconductor layer 31 in contact with the p type semiconductor layer 32.

Alternatively, based on heat applied in setting an atmosphere around the semiconductor substrate 20, n type semiconductor layer 30, i type semiconductor layer 31, p type semiconductor layer 32, and passivation semiconductor layer 40 to the temperature of about 550° to 700° C., Zn as the impurity of the second conduction type is diffused from the p type semiconductor layer 32 into the interfacial regions of the passivation layer 40 and i type semiconductor layer 31 in contact with the p type semiconductor layer 32 to dope the interfacial regions therewith. Thus, the impurity-diffusing region 33 is formed by annealing in the interfacial regions of the passivation layer 40 and i type semiconductor layer 31 in contact with the p type semiconductor layer 32.

It is noted that there is no need to limit the impurity of the second conduction type diffused in this manner from the p type semiconductor layer 32 into the passivation semiconductor layer 40 and i type semiconductor layer 31 to Zn, but any element to exhibit the second conduction type, for example Be, Mn, Cd, etc., may be applied. A preferred element is one easy to diffuse.

Next explained is the operation of the pin-PD 2.

This pin-PD 2 functions substantially in the same manner as the pin-PD 1 of the above first embodiment except that near the heterojunction region between the passivation semiconductor layer 40 and the p type semiconductor layer 32, the interface of the pn junction region between the n type semiconductor layer 30 and the p type semiconductor layer 32 becomes a homojunction within the passivation semiconductor layer 40. This can further reduce the leak current flowing along the wall surfaces of the i type semiconductor layer 31 and p type semiconductor layer 32, which can greatly improve the device characteristics based on suppression of dark current.

Third Embodiment

Figure 5:
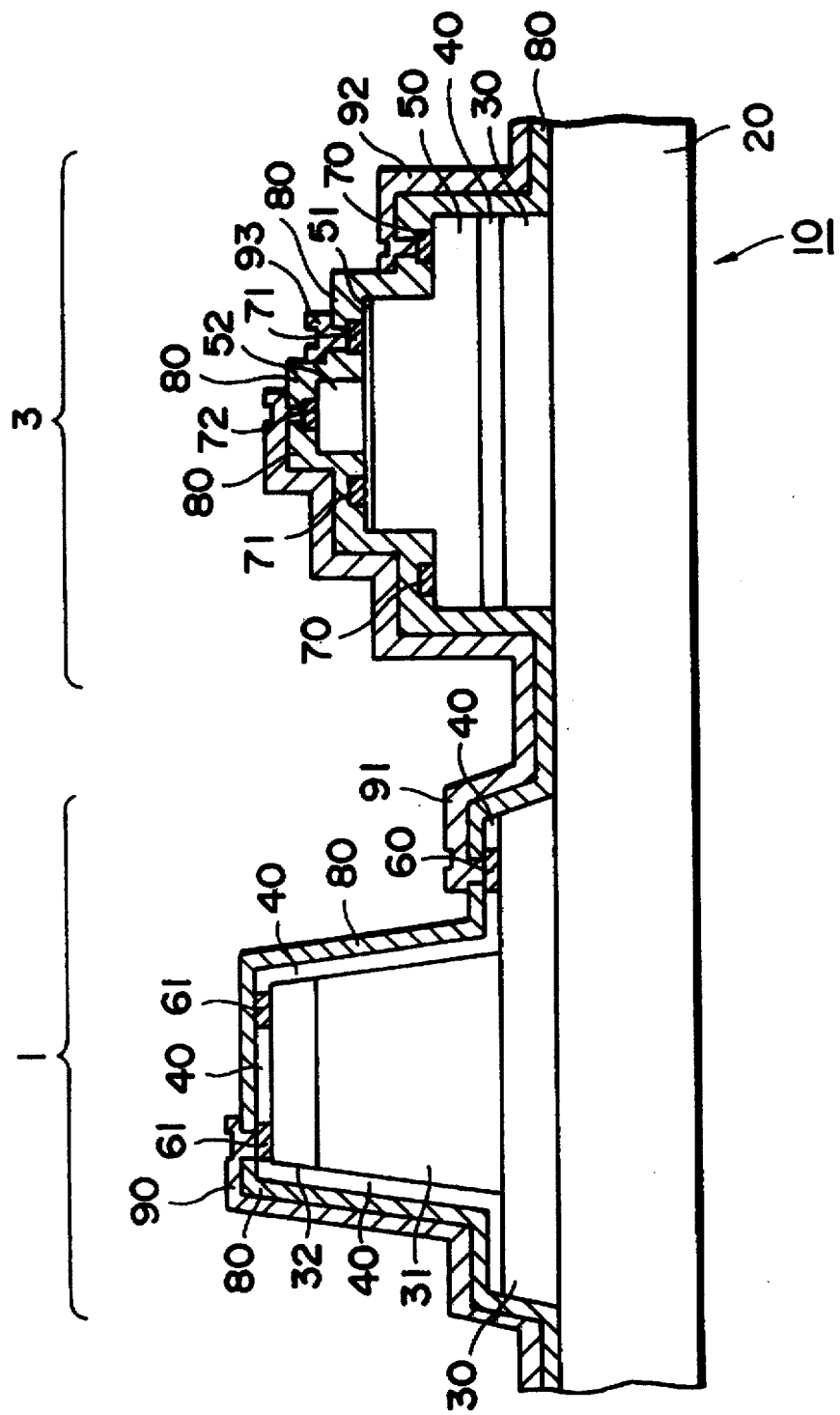
FIG. 5 is a sectional view to show the structure of the opto-electronic conversion circuit according to the third embodiment of the present invention.

As shown in FIG. 5, an opto-electronic conversion circuit 10 is composed of the pin-PD 1 as a pin type light-receiving device and an HBT 3 as an electronic device, as monolithically integrated on the semiconductor substrate 20. Here, the pin-PD 1 is the same as the pin-PD 1 of the above first embodiment.

On the other hand, the HBT 3 is constructed by successively laminating an n type semiconductor layer 30, a passivation semiconductor layer 40, a collector semiconductor layer 50, a base semiconductor layer 51, and an emitter semiconductor layer 52 on the semiconductor substrate 20. The emitter semiconductor layer 52 is formed in a mesa shape to singly compose a third mesa portion in a prism shape. The base semiconductor layer 51 and the upper part of the collector semiconductor layer 50 are formed each in a mesa shape, thus integrally composing a fourth mesa portion in a prism shape located under the bottom surface of the third mesa portion. The lower part of the collector semiconductor layer 50, the passivation semiconductor layer 40, and the n type semiconductor layer 30 are formed each in a mesa shape, thus integrally composing a fifth mesa portion in a prism shape located under the bottom surface of the fourth mesa portion.

On the top surface of the fifth mesa portion a collector electrode layer 70 is formed in a predetermined pattern in ohmic contact with the collector semiconductor layer 50. On the top surface of the fourth mesa portion a base electrode layer 71 is formed in a predetermined pattern in ohmic contact with the base semiconductor layer 51. On the top surface of the third mesa portion an emitter electrode layer 72 is formed in a predetermined pattern in ohmic contact with the emitter semiconductor layer 52.

Further, the first passivation insulator layer 80 is formed on the surface of the semiconductor substrate 20 and on the surfaces of the third to fifth mesa portions. Here, the first passivation insulator layer 80 has apertures each on the surfaces of the collector electrode layer 70, base electrode layer 71, and emitter electrode layer 72.

The collector semiconductor layer 50 is made of n type GaInAs doped with Si as the impurity of the first conduction type in the concentrations of about $1\times10^{19}$ cm$^{-3}$ and about $5\times10^{16}$ cm$^{-3}$ in the lower part and the upper part, respectively, and the lower part and upper part have the film thicknesses of about 300 nm and about 500 nm, respectively. The base semiconductor layer 51 is made of p type GaInAs doped with Zn as the impurity of the second conduction type different from the first conduction type in the concentration of about $1\times10^{19}$ cm$^{-3}$ and has the film thickness of about 100 nm. The emitter semiconductor layer 52 is made of n type InP doped with Si as the impurity of the first conduction type in the concentration of about $5\times10^{18}$ cm$^{-3}$, and has the film thickness of about 400 nm.

The collector electrode layer 70 is made of AuGe/Ni, in which the AuGe layer and the Ni layer have the film thicknesses of about 100 nm and about 30 nm, respectively. The base electrode layer 71 is made of Ti/Pt/Au, in which the Ti layer, Pt layer, and Au layer have the film thicknesses of about 20 nm, about 40 nm, and about 100 nm, respectively. The emitter electrode layer 72 is made of AuGe/Ni, in which the AuGe region and the Ni region have the film thicknesses of about 100 nm and about 30 nm, respectively.

Here, the collector semiconductor layer 50 and base semiconductor layer 51 both are made of GaInAs having the band gap energy of about 0.75 eV as a third semiconductor material, but have mutually different conduction types. The emitter semiconductor layer 52 is made of InP having the band gap energy of about 1.35 eV as a fourth semiconductor material having the band gap energy greater than that of the third semiconductor material forming the collector semiconductor layer 50 and the base semiconductor layer 51, and has the n type conduction.

In the pin-PD 1, first wiring layer 90 and second wiring layer 91 are formed in predetermined patterns in contact with the p type electrode layer 61 and the n type electrode layer 60, respectively, on the surface of the first passivation insulator layer 80. In the HBT 3, third wiring layer 92, fourth wiring layer 93, and second wiring layer 91 are formed in predetermined patterns in contact with the collector electrode layer 70, base electrode layer 71, and emitter electrode layer 72, respectively, on the surface of the first passivation insulator layer 80.

Here, the n type electrode layer 60 in pin-PD 1 is electrically connected through the second wiring layer 91 with the emitter electrode layer 72 in HBT 3. The first to the fourth wiring layers 90 to 93 all are made of Ti/Au.

Next explained are fabrication steps of the opto-electronic conversion circuit 10.

Figure 6A:
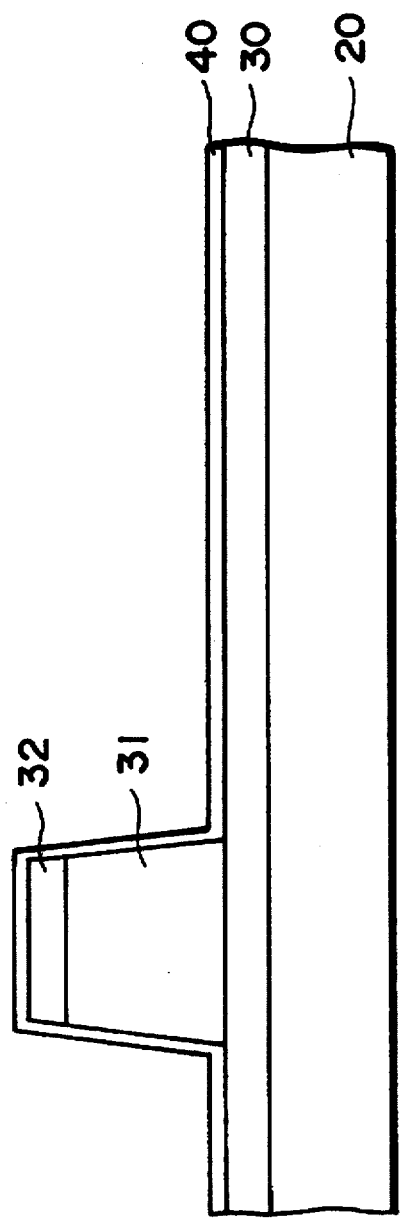
FIGS. 6A and 6B are sectional views to sequentially show fabrication steps of the opto-electronic conversion circuit of FIG. 5.

First, as shown in FIG. 6A, this opto-electronic conversion circuit 10 is started almost in the same process as the pin-PD 1 was fabricated in the above first embodiment, in which the n type semiconductor layer 30, i type semiconductor layer 31, and p type semiconductor layer 32 are successively laminated on the surface of the semiconductor substrate 20, the p type semiconductor layer 32 and i type semiconductor layer 33 are successively processed in the mesa shape, and thereafter the passivation semiconductor layer 40 is formed around the first mesa portion.

Figure 6B:
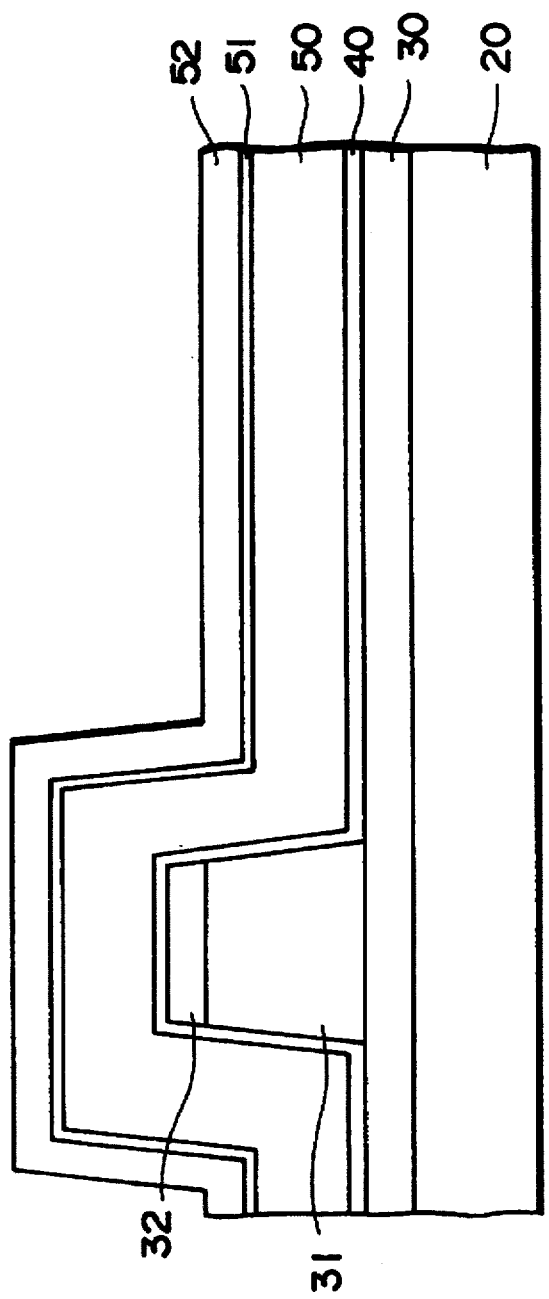

Subsequently, as shown in FIG. 6B, the collector semiconductor layer 50, base semiconductor layer 51, and emitter semiconductor layer 52 are formed as successively laminated on the surface of the passivation semiconductor layer 40 by the ordinary OMVPE process.

Figure 7A:
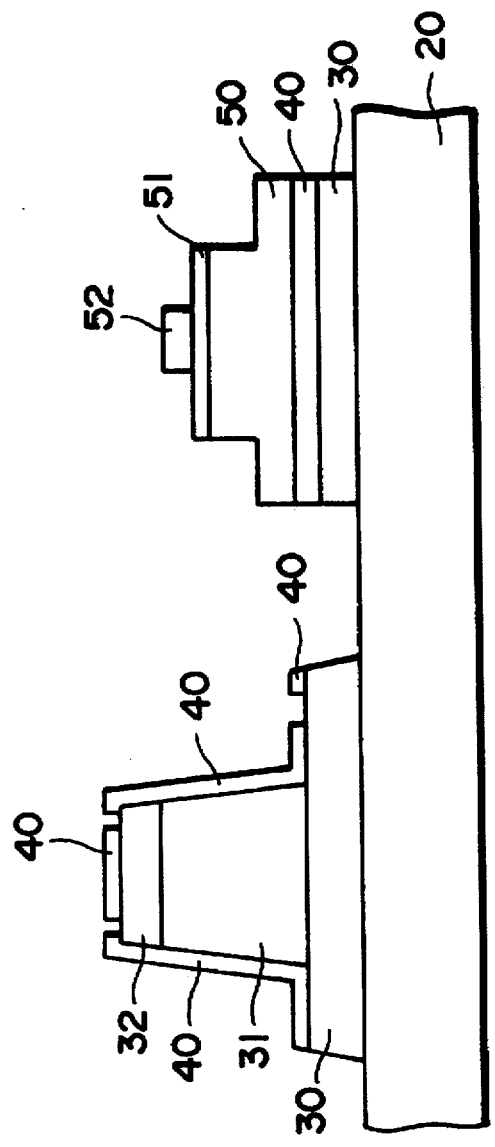
FIGS. 7A and 7B are sectional views to sequentially show fabrication steps of the opto-electronic conversion circuit of FIG. 5.

Next, as shown in FIG. 7A, a fifth mask is formed in a rectangular pattern on the third mesa portion forming region of the emitter semiconductor layer 52 in the HBT forming region of the semiconductor substrate 20 by the ordinary photolithography technology. Then the peripheral region of the emitter semiconductor layer 52 exposed from the fifth mask is removed with the HCl based etchant by the ordinary wet etching process. The emitter semiconductor layer 52 is thus processed in the mesa shape, thus forming the third mesa portion.

After that, a sixth mask is formed similarly in a rectangular pattern on the fourth mesa portion forming region of the base semiconductor layer 51. Then the peripheral region of the base semiconductor layer 51 exposed from the sixth mask is removed with the $H_3PO_4$ based etchant by the ordinary wet etching process. The base semiconductor layer 51 and the upper part of the collector semiconductor layer 50 are processed each in the mesa shape, thus forming the fourth mesa portion.

Further, a seventh mask is formed in the same manner in a rectangular pattern on the fifth mesa portion forming region of the collector semiconductor layer 50. Then the peripheral region of the collector semiconductor layer 50 exposed from the seventh mask is removed successively with the $H_3PO_4$ based etchant, the HCl based etchant, and the $H_3PO_4$ based etchant by the ordinary wet etching process. Thus, the lower part of the collector semiconductor layer 50, the passivation semiconductor layer 40, and the n type semiconductor layer 50 are processed each in the mesa shape, thus forming the fifth mesa portion.

On the other hand, a second mask is formed in a circular pattern on the second mesa portion forming region of the passivation semiconductor layer 40 in the pin-PD forming region of the semiconductor substrate 20 by the ordinary photolithography technology. Then the peripheral region of the passivation semiconductor layer 40 exposed from the second mask is removed with the HCl based etchant by the ordinary wet etching process. Thus, the passivation semiconductor layer 40 and the n type semiconductor layer 30 are successively processed in the mesa shape, thus forming the second mesa portion.

After that, a third mask is formed in the same manner in predetermined patterns on the surface of the passivation semiconductor layer 40, and the inside regions of the passivation semiconductor layer 40 exposed from the third mask are removed. Thus, the predetermined regions of the n type semiconductor layer 30 and p type semiconductor layer 32 are exposed as the n electrode layer forming region and the p type electrode layer forming region, respectively.

Figure 7B:
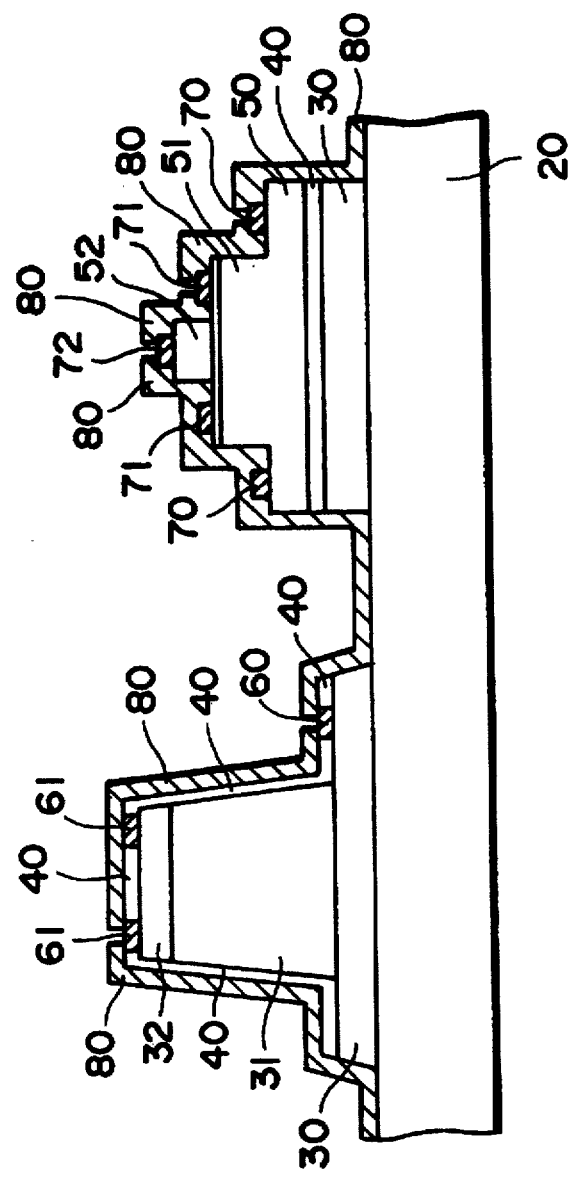

Subsequently, as shown in FIG. 7B, the n type electrode layer 60 and p type electrode layer 61 are formed in the predetermined regions exposed in the n type semiconductor layer 30 and the p type semiconductor layer 32, respectively, in the pin-PD forming region of the semiconductor substrate 20 by the ordinary vacuum vapor deposition process.

After that, the collector electrode layer 70, base electrode layer 71, and emitter electrode layer 72 are formed in the predetermined regions exposed in the collector semiconductor layer 50, base semiconductor layer 51, and emitter semiconductor layer 52, respectively, in the same manner in the HBT forming region of the semiconductor substrate 20.

Then the exposed surfaces of the n type semiconductor layer 30, i type semiconductor layer 31, p type semiconductor layer 32, and passivation semiconductor layer 40 are washed by immersing them in a washing solution of either the HCl based solution or the HF based solution by the ordinary wet etching process.

After that, the first passivation insulator layer 80 is formed on the surfaces of the semiconductor substrate 20, n type semiconductor layer 30, passivation semiconductor layer 40, collector semiconductor layer 50, base semiconductor layer 51, and emitter semiconductor layer 52 by the ordinary plasma CVD process.

Further, a fourth mask is formed in predetermined patterns on the surface of the first passivation insulator layer 80 in the pin-PD forming region of the semiconductor substrate 20 by the ordinary photolithography technology. In the HBT transistor forming region of the semiconductor substrate 20 an eighth mask is formed in predetermined patterns on the surface of the first passivation insulator layer 80. Then the inside regions of the first passivation insulator layer 80 exposed from these fourth and eighth masks are removed by the ordinary reactive ion etching (RIE) process. Thus, the surfaces of the n type electrode layer 60, p type electrode layer 61, collector electrode layer 70, base electrode layer 71, and emitter electrode layer 72 are exposed as regions for forming various wiring layers.

Subsequently, as shown in FIG. 5, a ninth mask is formed in predetermined patterns on the surface of the first passivation insulator layer 80 by the ordinary photolithography technology. Then the first wiring layer 90, second wiring layer 91, third wiring layer 92, and fourth wiring layer 93 each are formed on the surface of the first passivation insulator layer 80 exposed from the ninth mask by the ordinary vacuum vapor deposition process.

In the fabrication steps as described, the HBT 3 is formed as monolithically integrated with the pin-PD 1 formed in the fabrication steps of the above first embodiment on the surface of the semiconductor substrate 20. Because of it, the pin-PD 1 is formed with relatively good crystal quality of the passivation semiconductor layer 40, and the location of the pn junction region depends only upon the steps for forming the n type semiconductor layer 30, i type semiconductor layer 31, and p type semiconductor layer 32.

The pin-PD 1 is formed without doping the surfaces of the various semiconductor layers with diffusion of Zn, and is processed in the mesa shape. It is thus easy to achieve an increase of the diameter of wafer forming the semiconductor substrate 20, and it is also easy to monolithically integrate an active element such as HBT 3 with pin-PD 1.

Next explained is the operation of the opto-electronic conversion circuit 10.

In the opto-electronic conversion circuit 10, the HBT 3 is formed as monolithically integrated with the pin-PD 1 of the above first embodiment on the surface of the semiconductor substrate 20. This can reduce the leak current in the pin-PD 1, which can decrease occurrence of noise in HBT 3. The receiving sensitivity of HBT 3 can be improved to light signals entering the pin-PD 1 accordingly.

Fourth Embodiment

Figure 8:
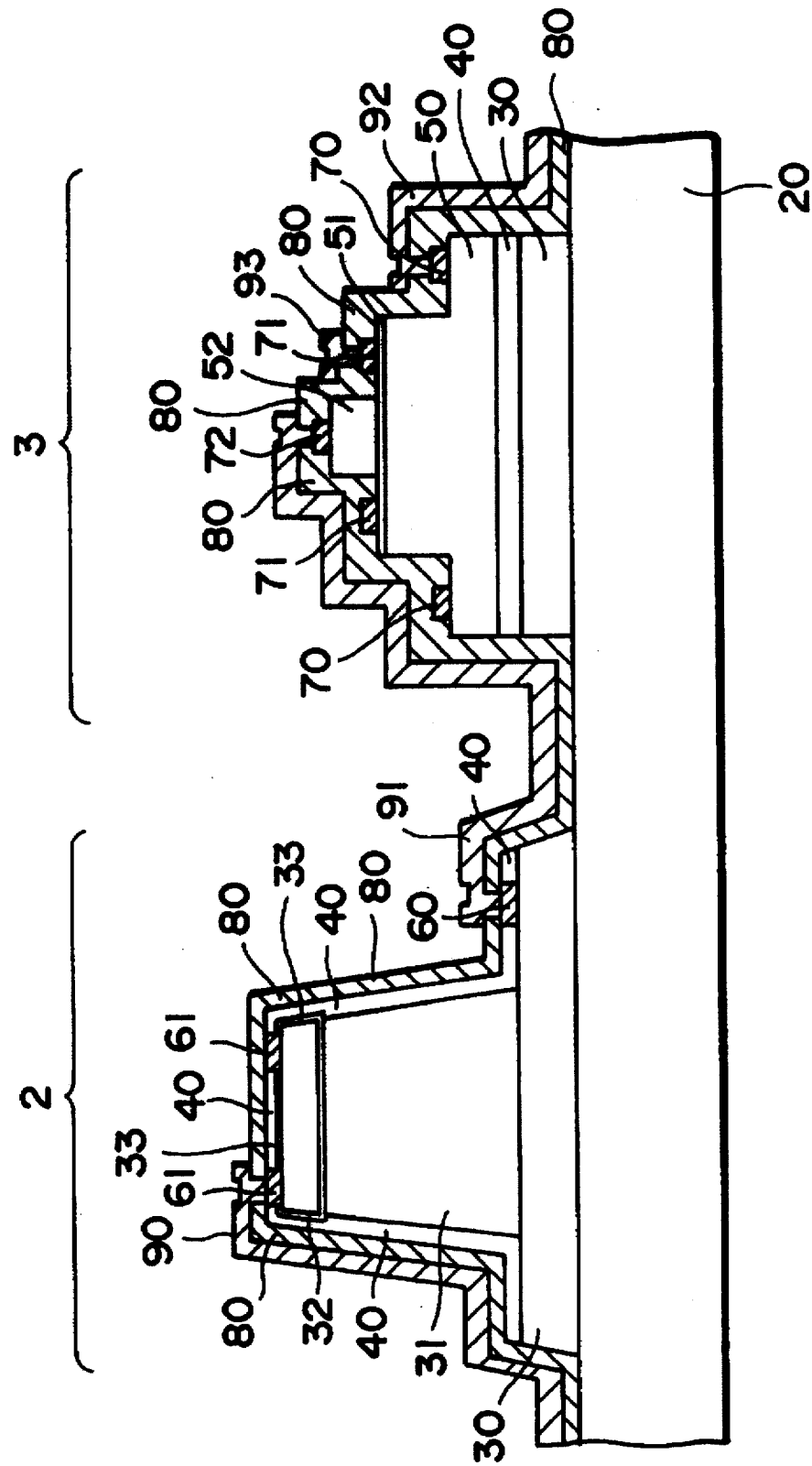
FIG. 8 is a sectional view to show the structure of the opto-electronic conversion circuit according to the fourth embodiment of the present invention.

As shown in FIG. 8, an opto-electronic conversion circuit 11 is constructed substantially in the same manner as the opto-electronic conversion circuit 10 of the above third embodiment except that this opto-electronic conversion circuit 11 is constructed by monolithically integrating the pin-PD 2 as a pin type light-receiving device with the HBT 3 as an electronic device on the semiconductor substrate 20. The pin-PD 2 is the same as the pin-PD 2 of the above second embodiment.

Next explained are fabrication steps of the opto-electronic conversion circuit 11.

This opto-electronic conversion circuit 11 is fabricated substantially in the same manner as the opto-electronic conversion circuit 10 of the above third embodiment except that, based on the heat applied in growing the passivation semiconductor layer 40 on the surface of the p type semiconductor layer 32, Zn is diffused as the impurity of the second conduction type from the p type semiconductor layer 32 into the interfacial region of the passivation layer 40 and i type semiconductor layer 31 in contact with the p type semiconductor layer 32 to dope the interfacial region therewith.

Alternatively, based on the heat applied in order to set the atmosphere around the semiconductor substrate 20, n type semiconductor layer 30, i type semiconductor layer 31, p type semiconductor layer 32, and passivation semiconductor layer 40 to the temperature of about 550° to 700° C., Zn is diffused as the impurity of the second conduction type from the p type semiconductor layer 32 into the interfacial regions of the passivation layer 40 and i type semiconductor layer 31 in contact with the p type semiconductor layer 32 to dope the interfacial regions therewith.

Further, based on heat applied in successively growing the collector semiconductor layer 50, base semiconductor layer 51, and emitter semiconductor layer 52 on the surface of the passivation semiconductor layer 40, Zn is diffused as the impurity of the second conduction type from the p type semiconductor layer 32 into the interfacial region of the passivation layer 40 and i type semiconductor layer 31 in contact with the p type semiconductor layer 32 to dope the interfacial region therewith. The above forms the impurity-diffusing region 33 in the interfacial regions of the passivation layer 40 and i type semiconductor layer 31 in contact with the p type semiconductor layer 32.

Next explained is the operation of the opto-electronic conversion circuit 11.

This opto-electronic conversion circuit 11 functions substantially in the same manner as the opto-electronic conversion circuit 10 of the above third embodiment except that near the heterojunction region between the passivation semiconductor layer 40 and the p type semiconductor layer 32 the interface of the pn junction region between the n type semiconductor layer 30 and the p type semiconductor layer 32 becomes a homojunction in the passivation semiconductor layer 40.

This further decreases the leak current flowing along the wall surfaces of the i type semiconductor layer 31 and p type semiconductor layer 32 in the pin-PD 2, which can further decrease occurrence of noise in HBT 3. The receiving sensitivity of HBT 3 can considerably be improved to light signals entering the pin-PD 2 accordingly.

Fifth Embodiment

As shown in FIG. 9, an opto-electronic conversion circuit 12 is constructed by monolithically integrating the pin-PD 1 as a pin type light-receiving device with a resistor 4 and a capacitor 5 as electronic devices on the semiconductor substrate 20.

Here, pin-PD 1 is the same as the pin-PD 1 of the above first embodiment. In the pin-PD 1, a second passivation insulator layer 81 is formed on the surface of the first passivation insulator layer 80. This second passivation insulator layer 81 has apertures communicating with the apertures of the first passivation insulator layer 80 located above the surfaces of the n type electrode layer 60 and type electrode layer 61.

On the other hand, the resistor 4 is formed by successively laminating the first passivation semiconductor layer 80, a metal resistance layer 110, and the second passivation semiconductor layer B1 on the semiconductor substrate 20. This metal resistance layer 110 is formed in a flat plate shape, which is covered by the first and second passivation layers 80, 81. The second passivation layer 81 has apertures above the surface of the metal resistance layer 110.

The capacitor 5 is formed as an MIM (Metal-Insulator-Metal) type capacitor by successively laminating a lower electrode layer 100, the second passivation insulator layer 81, and an upper electrode layer 101 on the semiconductor substrate 20. The lower electrode layer 100 is formed in a flat plate shape and is in contact with the top surface of the semiconductor substrate 20. The second passivation insulator layer 81 has an aperture in the region located above the surface of the lower electrode layer 100 but not below the upper electrode layer 101. The upper electrode layer 101 is formed in a flat plate shape and is located as opposed to the lower electrode layer 100 with the second passivation insulator layer 81 inbetween.

The second passivation insulator layer 81 is made of SiN and has the film thickness of about 100 to 200 nm. The metal resistance layer 110 is made of NiCr and has the film thickness of about 20 to 40 nm. The lower electrode layer 100 is made of Ti/Au and has the film thickness of about 200 to 400 nm. The upper electrode layer 101 is made of Ti/Au and has the film thickness of about 300 to 500 nm.

In the pin-PD 1, fifth wiring layer 94 and sixth wiring layer 95 are formed in predetermined patterns in contact with the p type electrode layer 61 and the n type electrode layer 60, respectively, on the surface of the second passivation insulator layer B1. In the resistor 4, sixth wiring layer 95 and seventh wiring layer 96 are formed in predetermined patterns both in contact with the metal resistance layer 110 on the surface of the second passivation insulator layer 81. In the capacitor 5, seventh wiring layer 96 and eighth wiring layer 97 are formed in predetermined patterns in contact with the upper electrode layer 101 and the lower electrode layer 100, respectively, on the surface of the second passivation insulator layer 81.

Here, the n type electrode layer 60 in the pin-PD 1 is electrically connected through the sixth wiring layer 95 with the metal resistance layer 110 in the resistor 4. The metal resistance layer 110 in the resistor 4 is electrically connected through the seventh wiring layer 96 with the lower electrode layer 100 in the capacitor 5. The fifth to eighth wiring layers 94 to 97 all are made of Ti/Au.

Next explained are fabrication steps of the opto-electronic conversion circuit 12.

First, as shown in FIG. 10A, the opto-electronic conversion circuit 12 is fabricated to construct the pin-PD 1 substantially in the same manner as the pin-PD 1 of the above first embodiment: the n type semiconductor layer 30, i type semiconductor layer 31, and type semiconductor layer 32 are successively laminated on the surface of the semiconductor substrate 20, the p type semiconductor layer 32 and i type semiconductor layer 33 are successively processed in the mesa shape, and thereafter the passivation semiconductor layer 40 is formed around the first mesa portion.

Subsequently, as shown in FIG. 10B, a second mask is formed in a circular pattern on the second mesa portion forming region of the passivation semiconductor layer 40 in the pin-PD forming region of the semiconductor substrate 20 by the ordinary photolithography technology. Then the peripheral region of the passivation semiconductor layer 40 exposed from the second mask is removed with the HCl based etchant by the ordinary wet etching process. Thus, the passivation semiconductor layer 40 and n type semiconductor layer 30 are successively processed in the mesa shape, thus forming the second mesa portion.

After that, a third mask is formed similarly in predetermined patterns on the surface of the passivation semiconductor layer 40, and the inside regions of the passivation semiconductor layer 40 exposed from the third mask are removed. Thus, the predetermined regions of the n type semiconductor layer 30 and p type semiconductor layer 32 are exposed as the n electrode layer forming region and the p type electrode layer forming region.

Subsequently, as shown in FIG. 11A, the n type electrode layer 60 and p type electrode layer 61 are formed in the predetermined regions exposed in the n type semiconductor layer 30 and the p type semiconductor layer 32, respectively, in the pin-PD forming region of the semiconductor substrate 20 by the ordinary vacuum vapor deposition process.

After that, the exposed surfaces of the n type semiconductor layer 30, i type semiconductor layer 31, p type semiconductor layer 32, and passivation semiconductor layer 40 are washed by immersing them in a washing solution of either the hydrochloric acid (HCl) based solution or the hydrofluoric acid (HF) based solution by the ordinary wet etching process.

Then the first passivation insulator layer 80 is formed on the surfaces of the semiconductor substrate 20, n type semiconductor layer 30, i type semiconductor layer 31, p type semiconductor layer 32, and passivation semiconductor layer 40 by the ordinary plasma CVD process.

After that, a tenth mask is formed in a predetermined patterns on the surface of the first passivation insulator layer 80 in the capacitor forming region of the semiconductor substrate 20 by the ordinary photolithography technology. Then the inside region of the first passivation insulator layer 80 exposed from the tenth mask is removed by the ordinary RIE process. This exposes the surface of the semiconductor substrate 20 as a capacitor forming region.

Subsequently, as shown in FIG. 11B, the lower electrode layer 100 is formed in the predetermined region exposed of the semiconductor substrate 20 in the capacitor forming region of the semiconductor substrate 20 by the ordinary vacuum vapor deposition process.

After that, an eleventh mask is formed in a predetermined pattern on the surface of the second passivation insulator layer 81 in the resistor forming region of the semiconductor substrate 20 by the ordinary photolithography technology. Then the metal resistance layer 110 is formed in the predetermined region exposed from the eleventh mask by the ordinary vacuum vapor deposition process.

Next, the second passivation insulator layer 81 is formed on the exposed surfaces of the first passivation insulator layer 80, lower electrode layer 100, and metal resistance layer 110 by the ordinary plasma CVD process.

After that, a fourth mask is formed in predetermined patterns on the surface of the second passivation insulator layer 81 in the pin-PD forming region of the semiconductor substrate 20 by the ordinary photolithography technology. A twelfth mask is formed in predetermined patterns on the surface of the second passivation insulator layer 81 in the resistor forming region of the semiconductor substrate 20. A thirteenth mask is formed in a predetermined pattern on the surface of the second passivation insulator layer 81 in the capacitor forming region of the semiconductor substrate 20.

Further, the inside regions of the second passivation insulator layer 81 exposed from these fourth, twelfth, and thirteenth masks are removed by the ordinary RIE process. Thus, the surfaces of the n type electrode layer 60, p type electrode layer 61, lower electrode layer 100, and metal resistance layer 110 each are exposed as regions for forming the various wiring layers.

Subsequently, as shown in FIG. 9, a fourteenth mask is formed in predetermined patterns on the surface of the second passivation insulator layer 81 by the ordinary photolithography technology. Then the fifth wiring layer 94, sixth wiring layer 95, seventh wiring layer 96, and eighth wiring layer 97 each are formed on the surface of the second passivation insulator layer 81 exposed from the fourteenth mask by the ordinary vacuum vapor deposition process.

In the fabrication steps as described, the resistor 4 and capacitor 5 are formed as monolithically integrated with the pin-PD 1 formed in the fabrication steps of the above first embodiment on the surface of the semiconductor substrate 20. Because of it, the pin-PD 1 is formed in relatively good crystal quality of the passivation semiconductor layer 40, and the location of the pn junction region depends only upon the steps for forming the n type semiconductor layer 30, i type semiconductor layer 31, and p type semiconductor layer 32.

The pin-PD 1 is formed without doping the surfaces of the various semiconductor layers with diffusion of Zn and is processed in the mesa shape. It is thus easy to achieve an increase of the diameter of wafer forming the semiconductor substrate 20 and it is also easy to monolithically integrate the pin-PD 1 with passive elements such as resistor 4 and capacitor 5.

Next explained is the operation of the opto-electronic conversion circuit 12.

In this opto-electronic conversion circuit 12, the resistor 4 and capacitor 5 are monolithically integrated with the pin-PD 1 of the above first embodiment on the surface of the semiconductor substrate 20. Thus, the resistor 4 and capacitor 5 are not in contact with the various semiconductor layers forming the pin-PD 1, which does not hinder the reduction of leak current in the pin-PD 1. The device characteristics of pin-PD 1 can be improved accordingly.

Sixth Embodiment

Figure 12:
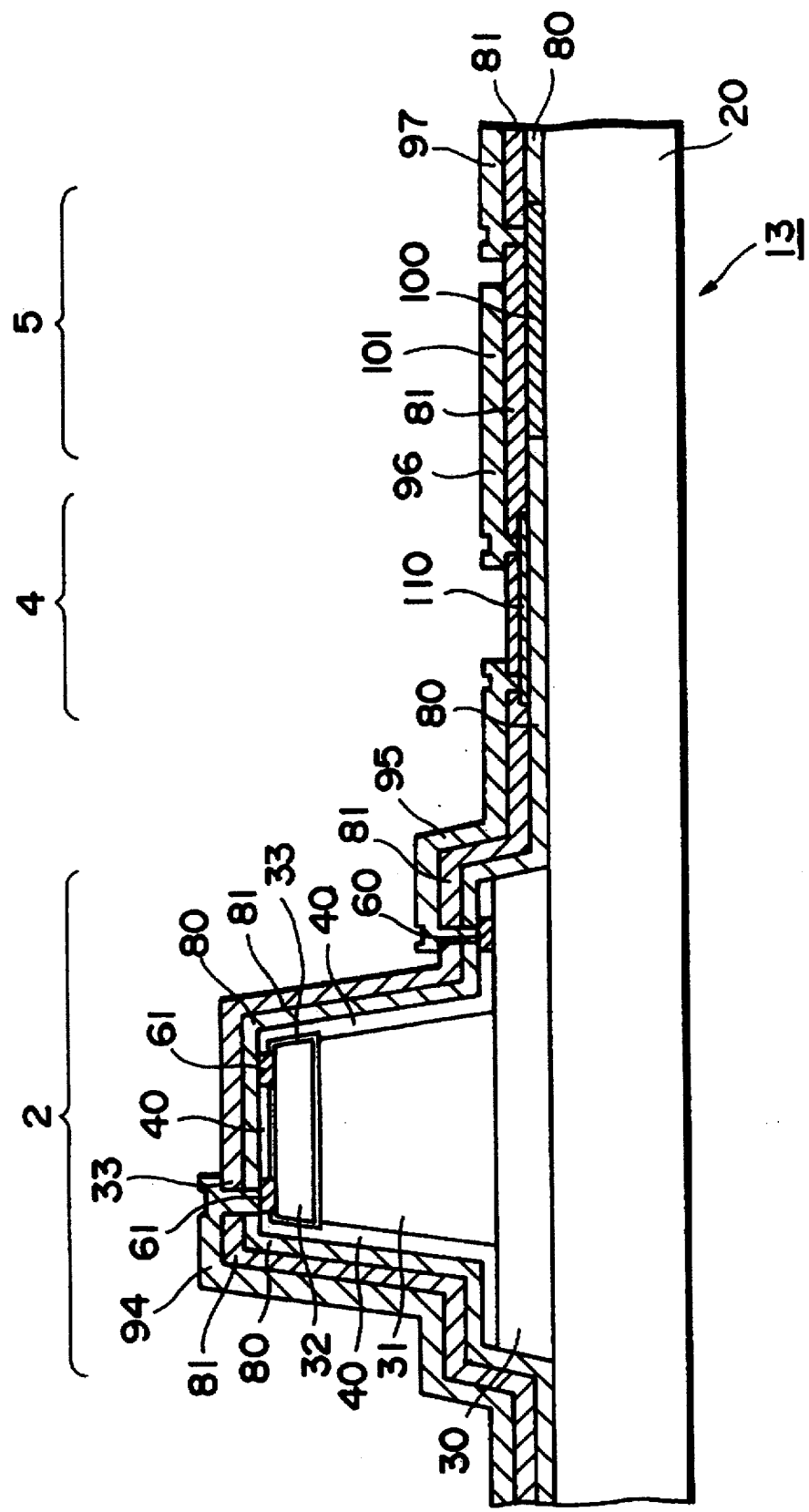
FIG. 12 is a sectional view to show the structure of the opto-electronic conversion circuit according to the sixth embodiment of the present invention.

As shown in FIG. 12, an opto-electronic conversion circuit 13 is constructed substantially in the same manner as the opto-electronic conversion circuit 12 of the above fifth embodiment except that the opto-electronic conversion circuit 13 is constructed by monolithically integrating the pin-PD 2 as a pin type light-receiving device with the resistor 4 and capacitor 5 as electronic devices on the semiconductor substrate 20. The pin-PD 2 is the same as the pin-PD 2 of the above second embodiment.

Next explained are fabrication steps of the opto-electronic conversion circuit 13.

This opto-electronic conversion circuit 13 is fabricated substantially in the same manner as the opto-electronic conversion circuit 12 of the above fifth embodiment except that, based on the heat applied in growing the passivation semiconductor layer 40 on the surface of the p type semiconductor layer 32, Zn is diffused as the impurity of the second conduction type from the p type semiconductor layer 32 into the interfacial region of the passivation layer 40 and i type semiconductor layer 31 in contact with the p type semiconductor layer 32 to dope the interfacial region therewith.

Alternatively, based on the heat applied in order to set the atmosphere around the semiconductor substrate 20, n type semiconductor layer 30, i type semiconductor layer 31, p type semiconductor layer 32, and passivation semiconductor layer 40 to the temperature of about 550° to 700° C., Zn is diffused as the impurity of the second conduction type from the p type semiconductor layer 32 into the interfacial regions of the passivation layer 40 and i type semiconductor layer 31 in contact with the p type semiconductor layer 32 to dope the interfacial regions therewith.

Next explained is the operation of the opto-electronic conversion circuit 13.

This opto-electronic conversion circuit 13 functions substantially in the same manner as the opto-electronic conversion circuit 12 of the above fifth embodiment except that near the heterojunction region between the passivation semiconductor layer 40 and the p type semiconductor layer 32 the interface of the pn junction region between the n type semiconductor layer 30 and the p type semiconductor layer 32 becomes a homojunction in the passivation semiconductor layer 40. This can further reduce the leak current in the pin-PD 2. The device characteristics of the pin-PD 1 can be improved accordingly.

Seventh Embodiment

Figure 13:
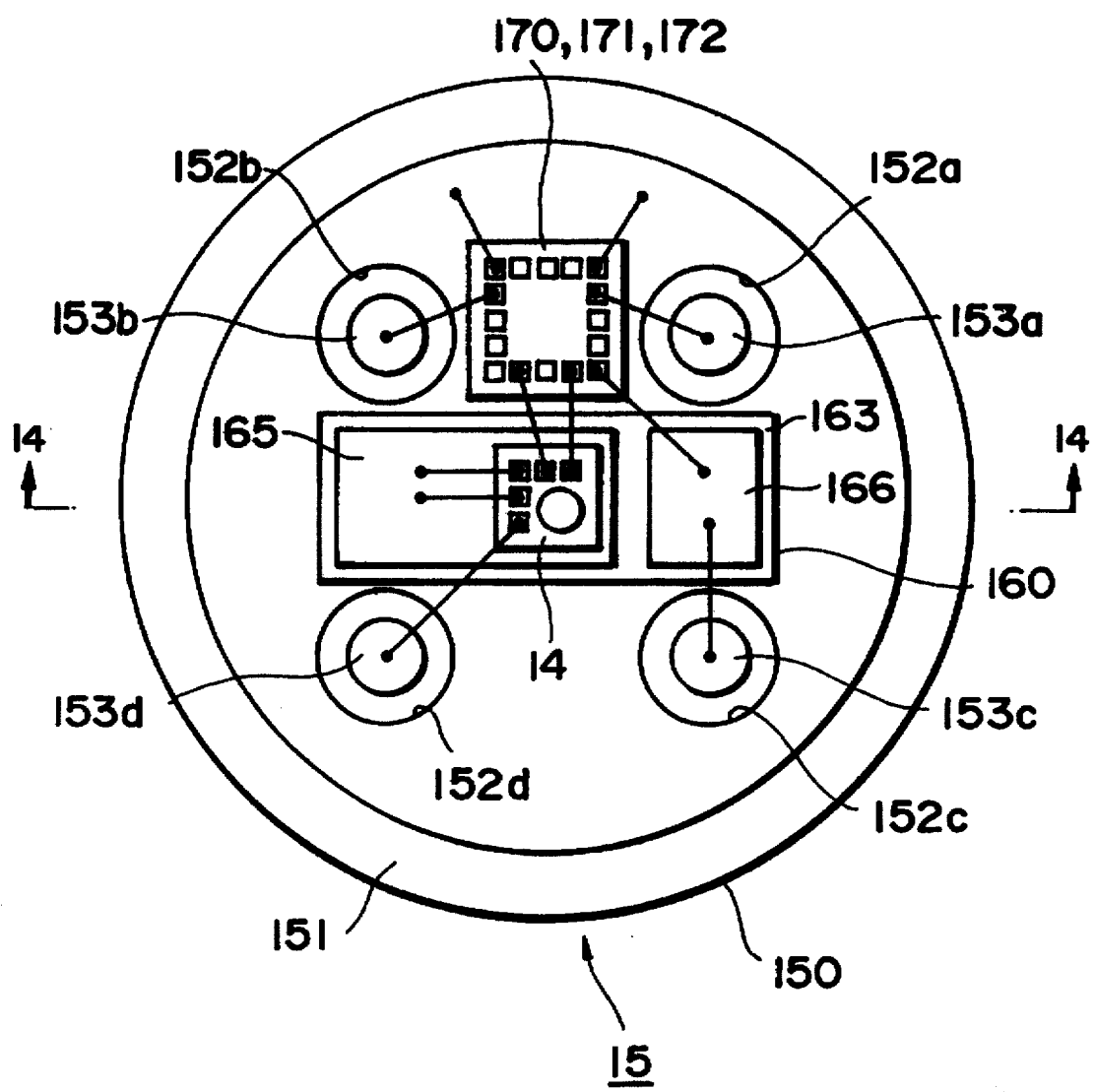
FIG. 13 is a top plan view showing a configuration of an opto-electronic conversion module in accordance with the seventh embodiment of the present invention.
Figure 14:
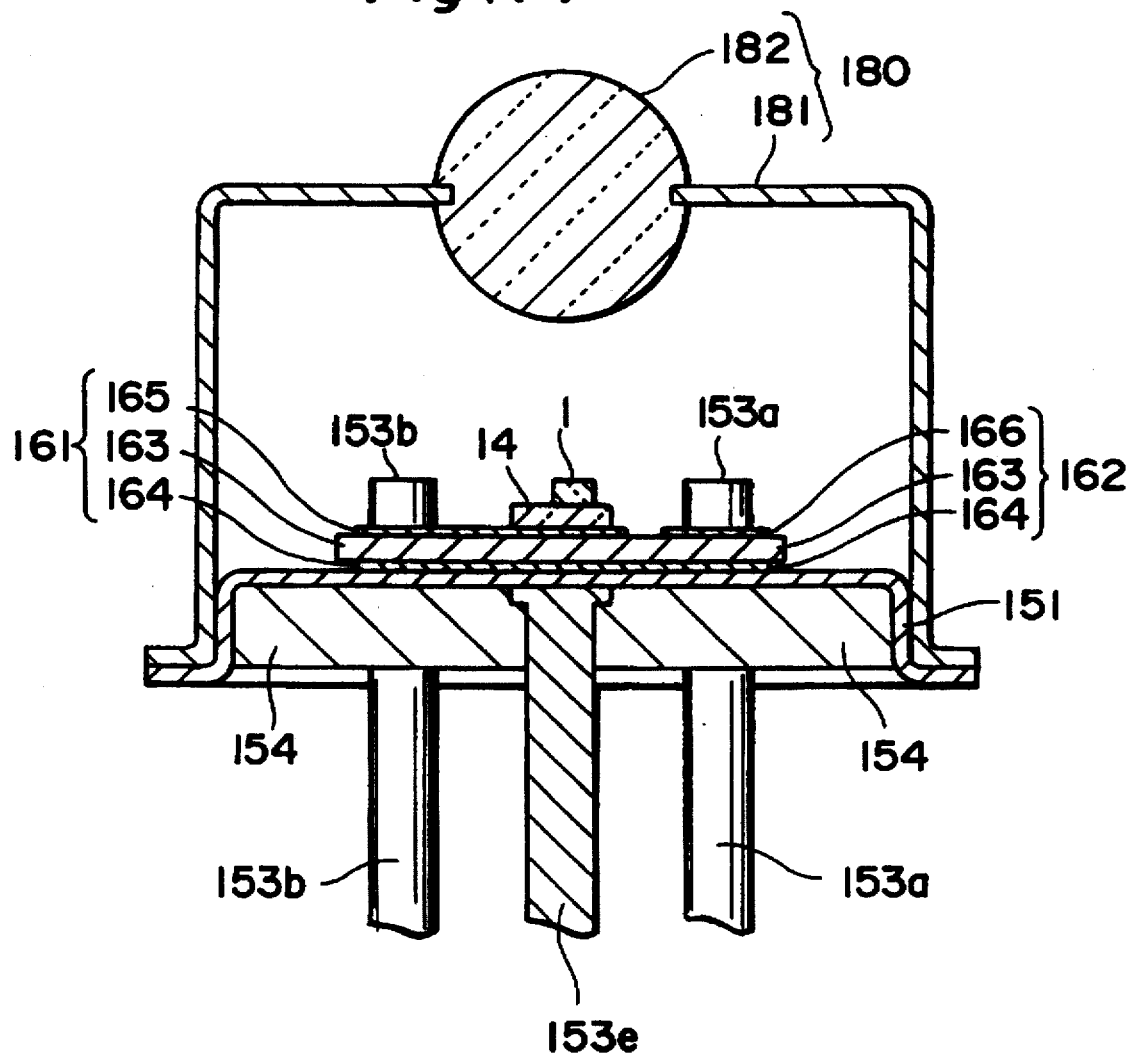
FIG. 14 is a cross-sectional view taken along the line A—A of FIG. 13.

As shown in FIGS. 13 and 14, in an opto-electronic conversion module 15, a die cap 160 and an IC chip 170 are mounted on a top portion of a TO package 150. Also, an opto-electronic conversion circuit 14 is further mounted on the surface of the die cap 160, while a light-condensing cover with 180 is attached onto a periphery of the TO package 150.

The TO package 150 is formed with TO 1B configuration in TO package standard. In this TO package 150, four through holes 152a to 152d are formed at a top portion of a conductive substrate 151 which has been processed into a circular flat plate having a thick plateau portion inside thereof. First to fourth lead pins 153a to 153d are inserted through these four through holes 152a to 152d, while a fifth lead pin 153e is welded to the inner surface of the top portion of the conductive substrate 151.

The first to fifth lead pins 153a to 153e are fixed as the inside of the conductive substrate 151 is filled with a glass material 154. The conductive substrate 151 and first to fourth lead pins 153a to 153d are made of a metal member and insulated from each other by the glass material 154 disposed therebetween. Here, the fifth lead pin 153e is made of a metal member and electrically connected to the conductive substrate 151.

The pitch between the fifth lead pin 153e disposed at the center portion of the conductive substrate 151 and the first to fourth lead pins 153a to 153d disposed at the periphery of the conductive substrate 151 is about 1.27 mm. Accordingly, the packaging of the substrate can become easy and a commercially-available connector socket can be used, whereby driving tests can be performed in a simple manner.

The die cap 160 is fixed to the outer surface of the top portion of the conductive substrate 151 in the TO package 150 by soldering. In this die cap 160, a rear electrode layer 164 is formed on the whole rear surface of an insulating substrate 163, while a first surface electrode layer 165 and a second surface electrode layer 166 are formed so as to divide the surface of the insulating substrate 163 into two.

As a result, a first bypassing capacitor 161 is formed as an MIM type capacitor in which the rear electrode layer 164, the insulating substrate 163, and the first surface electrode layer 165 are successively laminated. Also, a second bypassing capacitor 162 is formed as an MIM type capacitor in which the rear electrode layer 164, the insulating substrate 163, and the second surface electrode layer 166 are successively laminated.

The IC chip 170 is fixed to the outer surface of the top portion of the conductive substrate 151 in the TO package 150 by soldering and disposed close to the die cap 160. In this IC chip 170, first preamplifier 171 and second preamplifier 172 are formed with configurations identical to each other with their signal input terminals, signal output terminals, bias terminals, and earth terminals being exposed.

The light-condensing cover 180 is constituted by an opaque envelope 181 processed into a shape like a cup and a spheric lens 182 made of a glass member. The envelope 181 has an opening positioned at the center portion of the top surface thereof and is fixed to the outer surface of the peripheral portion of the conductive substrate 151 in the TO package 150 with an adhesive. The spheric lens 182 is fixed to the peripheral portion of the opening of the envelope 181 with an adhesive, is transparent to a signal light component which is detected by a pin-PD 1 and functions as a condenser lens for converging the signal light component into the light-receiving surface of the pin-PD 1.

Figure 15:
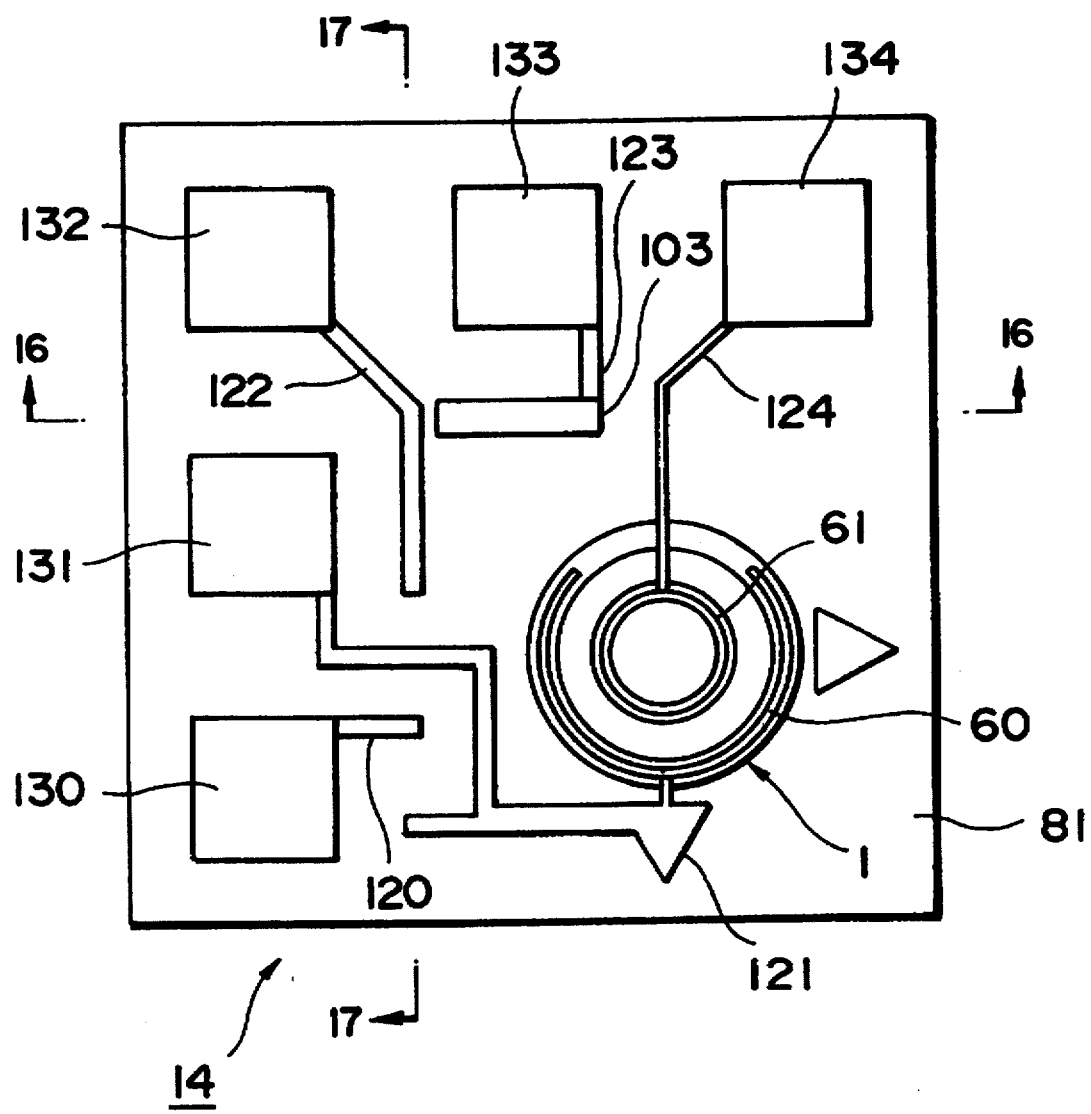
FIG. 15 is a top plan view showing a configuration of an opto-electronic conversion circuit in the opto-electronic conversion module shown in FIG. 13.
Figure 16:
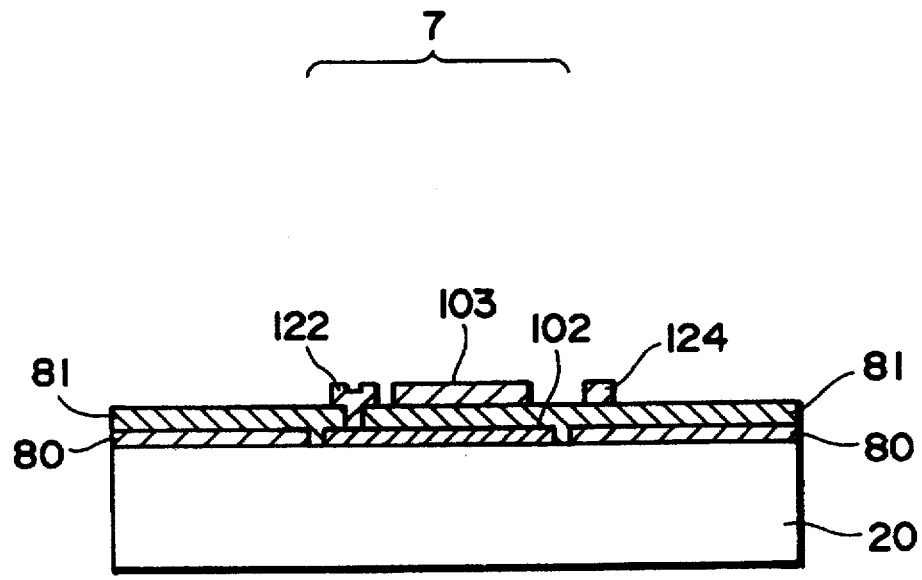
FIG. 16 is a cross-sectional view taken along the line B—B of FIG. 15.
Figure 17:
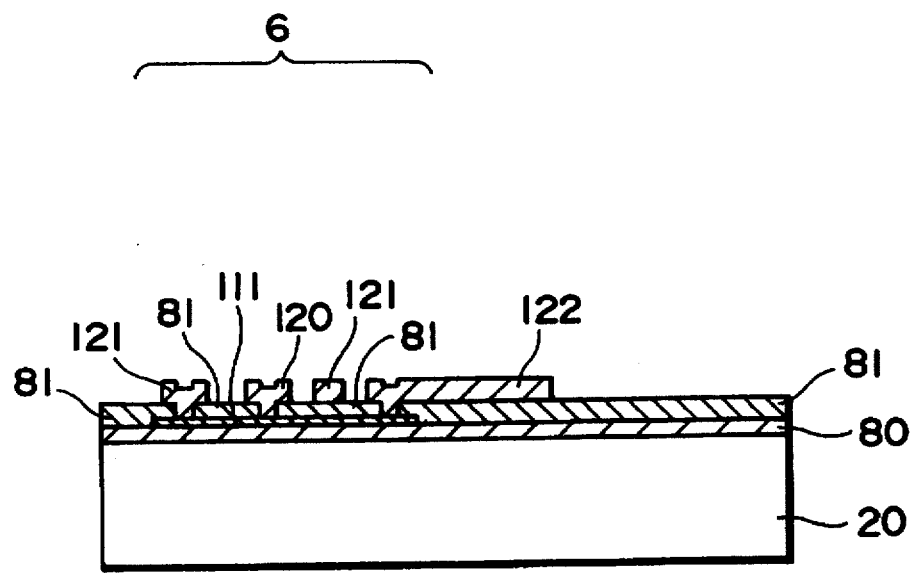
FIG. 17 is a cross-sectional view taken along the line C—C of FIG. 15.

As shown in FIGS. 15 to 17, the opto-electronic conversion circuit 14 is fixed to the surface of the first surface electrode layer 165 of the die cap 160 by soldering and configured substantially similar to that of the above-mentioned fifth embodiment. In this opto-electronic conversion circuit 14, however, the pin-PD 1, as a pin type light-receiving device, and a resistor 6 and an equivalent capacitance capacitor 7, as an electronic device, are monolithically integrated on a semiconductor substrate 20 and processed into a chip.

Here, in the pin-PD 1, which is identical to that in the above-mentioned fifth embodiment, a second passivation insulator layer 81 is formed on the surface of a first passivation insulator layer 80. This second passivation insulator layer B1 has two apertures which respectively communicate with two apertures of the first passivation insulator layer 80 positioned on the surfaces of an n type electrode layer 60 and a p type electrode layer 61.

The resistor 6, which is configured substantially similar to the resistor 4 of the above-mentioned fifth embodiment, is formed by the first passivation insulator layer 80, a metal resistance layer 111, and the second passivation insulator layer 81 which are successively laminated on the surface of the semiconductor substrate 20. The metal resistance layer 111 is formed like a flat plate between the first and second passivation insulator layers 80 and 81. The second passivation insulator layer 81 has three apertures positioned on the surface of the metal resistance layer 111.

The equivalent capacitance capacitor 7, which is configured substantially similar to the capacitor 5 of the above-mentioned fifth embodiment, is formed as an MIM type capacitor in which a lower electrode layer 102, the second passivation insulator layer 81, and an upper electrode layer 103 are successively laminated on the surface of the semiconductor substrate 20. This equivalent capacitance capacitor 7 has a capacitance value identical to that of the pin-PD 1.

In this equivalent capacitance capacitor 7, the lower electrode layer 102 is formed like a flat plate and directly in ohmic contact with the semiconductor substrate 20. The upper electrode layer 103 is formed like a flat plate and disposed so as to face the lower electrode layer 102 with the second passivation insulator layer 81 therebetween. The second passivation insulator layer 81 has an aperture in a region which is positioned above the lower electrode layer 102 but not below the upper electrode layer 103.

Between the pin-PD 1, the resistor 6, and the equivalent capacitance capacitor 7, first to fifth wiring patterns 120 to 124 and first to fifth pad patterns 130 to 134 are formed on the surface of the second passivation insulator layer 81.

The first wiring pattern 120 is formed in contact with the periphery of the first pad pattern 130 and the center portion of the metal resistance layer 111 in the resistor 6. The first pad pattern 130 is connected to the fourth lead pin 152d by way of a bonding wire and then, by way of the fourth lead pin 152d, to an output terminal of a power supply $V_{PD}$ for photodiode.

The second wiring pattern 121 is formed in contact with the periphery of the second pad pattern 131, a first end portion of the metal resistance layer 111, and the n type electrode layer 60 of the pin-PD 1. The second pad pattern 131 is connected to the first surface electrode layer 165 of the first bypassing capacitor 161 of the die cap 160 by way of a bonding wire.

The third wiring pattern 122 is formed in contact with the periphery of the third pad pattern 132, a second end portion of the metal resistance layer 111 of the resistor 6, and the lower electrode layer 102 of the equivalent capacitance capacitor 7. The third pad pattern 132 is connected to the first surface electrode layer 165 of the first bypassing capacitor 161 of the die cap 160 by way of a bonding wire.

The fourth wiring pattern 123 is formed in contact with the periphery of the fourth pad pattern 133 and the upper electrode layer 103 of the equivalent capacitance capacitor 7. The fourth pad pattern 133 is connected to the signal input terminal of the first preamplifier 171 of the IC chip 170 by way of a bonding wire.

The fifth wiring pattern 124 is formed in contact with the periphery of the fifth pad pattern 134 and the p type electrode layer 61 of the pin-PD 1. The fifth pad pattern 134 is connected to the signal input terminal of the second preamplifier 172 of the IC chip 170 by way of a bonding wire.

The common bias terminal of the first and second preamplifiers 171 and 172 is connected to the second surface electrode layer 166 of the second bypassing capacitor 162 of the die cap 160 by way of a bonding wire. The second surface electrode layer 166 of the second bypassing capacitor 162 is connected to the third lead pin 153c by way of a bonding wire and then, by way of the third lead pin 153c, to an output terminal of a power supply $V_{cc}$ for preamplifier.

The signal output terminal of the first preamplifier 171 is connected to the first lead pin 153a by way of a bonding wire and then, by way of the first lead pin 153a, to a first input terminal Q of a non-depicted differential input amplifier. On the other hand, the signal output terminal of the second preamplifier 172 is connected to the second lead pin 153b by way of a bonding wire and then, by way of the second lead pin 153b, to a second input terminal Q' of the non-depicted differential input amplifier.

Here, the rear electrode layer 164 of the first and second bypassing capacitors 161 and 162 is grounded by way of the conductive substrate 150 and the fifth lead pin 153e. Also, each of the earth terminals of the first and second preamplifiers 171 and 172 is connected to the conductive substrate 151 by way of a bonding wire and then grounded by way of the conductive substrate 150 and the fifth lead pin 153e.

Here, the first passivation semiconductor layer 80 is made of SiN and has a film thickness of about 200 nm. The second passivation semiconductor layer 81 is made of SiN and has a film thickness of about 170 nm. The first to fifth wiring patterns 120 to 124 are made of Ti/Au and a film thickness of about 300 to 500 nm. The metal resistance layer 111 is made of NiCrSi and has a sheet resistance of about 150 Ω/□ and a film thickness of about 25 nm.

The lower electrode layer 102 is made of Ti/Pt/Au and has a film thickness of about 200 to 400 nm. The upper electrode layer 103 is made of Ti/Au and has a thickness of about 300 to 500 nm. Each of the effective areas of the lower and upper electrode layers 102 and 103 vertically facing each other has a size of 30×120μm. As a result, the equivalent capacitance capacitor 7 has a capacity of about 1 pF.

Figure 18:
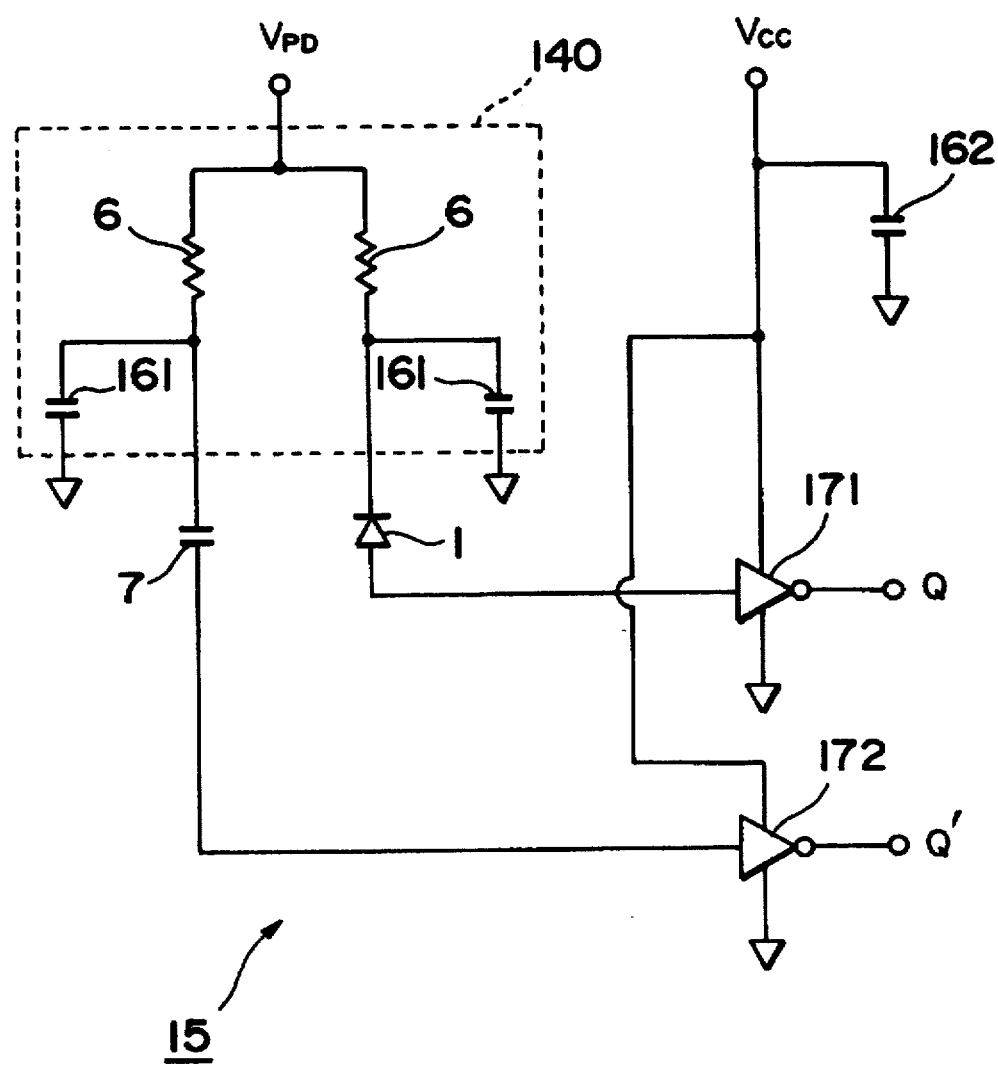
FIG. 18 is a circuit diagram showing a configuration of an equivalent circuit concerning an electronic circuit in the opto-electronic conversion module shown in FIG. 13.

As shown in FIG. 18, the electronic circuit in the opto-electronic conversion module 15 thus configured will be explained as a whole. The cathode 60 of the pin-PD 1 and the lower electrode layer 102 of the equivalent capacitance capacitor 7 are connected to the output terminal of the power supply $V_{PD}$ for photodiode by way of the bias circuit 140 and the fourth lead pin 153d. The anode 61 of the pin-PD 1 is connected to the signal input terminal of the first preamplifier 171, whereas the upper electrode layer 103 of the equivalent capacitance capacitor 7 is connected to the signal input terminal of the second preamplifier 172.

The signal output terminal of the first preamplifier 171 is connected to the first input terminal Q of the non-depicted differential input amplifier by way of the first lead pin 153a, whereas the signal output terminal of the second preamplifier 172 is connected to the second input terminal Q' of the non-depicted differential input amplifier by way of the second lead pin 153b.

Here, in the bias circuit 140, in order to reduce the noise generated due to fluctuations in the power supply $V_{PD}$ for photodiode, the resistor 6 and the first and second bypassing capacitors 161 and 162 constitute a low-pass RC filter.

Namely, the first end portion of the resistor 6 is connected to the n type electrode layer 60 of the pin-PD 1 and the first surface electrode layer 165 of the first bypassing capacitor 161. The second end portion of the resistor 6 is connected to the lower electrode layer 102 of the equivalent capacitance capacitor 7 and the first surface electrode layer 165 of the first bypassing capacitor 161. The center portion of the resistor 6 is connected to the output terminal of the power supply $V_{PD}$ for photodiode by way of the fourth lead pin 153d.

The common bias terminal of the first and second preamplifiers 171 and 172 is connected to the output terminal of the power supply $V_{cc}$ for preamplifier by way of the second surface electrode layer 166 of the second bypassing capacitor 162 and the third lead pin 153c. The earth terminals of the first and second preamplifiers 171 and 172 are respectively grounded by way of the conductive substrate 151 and the fifth lead pin 153e. Here, the rear electrode layer 163 of the first and second bypassing capacitors 161 and 162 is grounded by way of the conductive substrate 151 and the fifth lead pin 153e.

In the following, the operation of the opto-electronic conversion module 15 will be explained.

The pin-PD 1 and equivalent capacitance capacitor 7 in the opto-electronic conversion circuit 14 are biased by a predetermined voltage applied thereto from the power supply $V_{PD}$ for photodiode by way of the bias circuit 140, whereas the first and second preamplifiers 171 and 172 of the IC chip 170 are biased by a predetermined voltage applied thereto from the power supply $V_{cc}$ for preamplifier. At this time, the signal light component entering the light-condensing cover 180 from the outside is converged onto the light-receiving surface of the pin-PD 1 and opto-electronically converted within the pin-PD 1.

Then, the opto-electronically-converted signal generated by the pin-PD 1 is output to the first preamplifier 171 of the IC chip 170, whereby its signal component and noise component are amplified. On the other hand, the noise-compensating signal generated by the equivalent capacitance capacitor 7 is output to the second preamplifier 172 of the IC chip 170, whereby its noise component is amplified. Thus, the opto-electronically-converted signal amplified by the first preamplifier 171 and the noise-compensating signal amplified by the second preamplifier 172 are output to the differential input amplifier which is placed in front of a non-depicted comparator.

Since the pin-PD 1 and the equivalent capacitance capacitor 7 are monolithically formed on the semiconductor substrate 20 of the opto-electronic conversion circuit 14, the opto-electronically-converted signal and noise-compensating signal, which are their output signals, contain common mode noise components generated, for example, by fluctuations in environmental temperature and noise in the power supply $V_{PD}$ for photodiode. Therefore, in the opto-electronically-converted signal output from the differential input amplifier in front of the comparator, the noise component is totally offset by the noise-compensating signal.

Here, in the opto-electronic conversion circuit 14, the pin-PD 1, the resistor 6, and the equivalent capacitance capacitor 7 are monolithically integrated on the semiconductor substrate 20. Accordingly, since the resistor 6 and the equivalent capacitance capacitor 7 are not in contact with various semiconductor layers constituting the pin-PD 1, they do not prevent the leak current in the pin-PD 1 from decreasing. Therefore, the device characteristic of the pin-PD 1 can be improved.

It is noted here that the present invention is by no means limited to the above various embodiments, but the invention may have various arrangements and modifications. For example, in the above various embodiments, the pin type light-receiving devices are formed by successively laminating the n type semiconductor layer of InP, the i type semiconductor layer of GaInAs, and the p type semiconductor layer of GaInAs on the semiconductor substrate and covering these various semiconductor layers by the passivation semiconductor layer of InP.

However, the almost same operational effects as in the above various embodiments can be achieved by a pin type light-receiving device with the n type semiconductor layer and type semiconductor layer switched in location, formed by successively laminating the p type semiconductor layer, i type semiconductor layer, and n type semiconductor layer on the semiconductor substrate. In this arrangement, the substantially same operational effects as in the above various embodiments can be achieved by forming the impurity-diffusing region doped with diffusion of the n type impurity from the n type semiconductor layer into the interfacial regions of the passivation semiconductor layer and i type semiconductor layer in contact with the n type semiconductor layer.

There is no need to limit the material for making the i type semiconductor layer and the p type semiconductor layer and the material for making the passivation semiconductor layer to GaInAs and InP, respectively. Namely, any material can be applied as a material for making the passivation semiconductor layer with substantially the same operational effects as in the above various embodiments, as long as it has a band gap energy greater than that of the material for the i type semiconductor layer and the p type semiconductor layer.

The material for the n type semiconductor layer does not have to be limited to a semiconductor material different from the material for the i type semiconductor layer and type semiconductor layer. Namely, substantially the same operational effects as in the above various embodiments can be achieved by using the same semiconductor material for the n type semiconductor layer, i type semiconductor layer, and p type semiconductor layer.

The conduction type of the passivation semiconductor layer does not have to be limited to the i type, but may be set to the p type or the n type. However, in the case of the passivation semiconductor layer being set to the p type, the passivation semiconductor layer itself becomes the pn junction region, which could degrade the effect of decreasing the leak current. On the other hand, in the case of the passivation semiconductor layer being set to the n type, field strength increases between the passivation semiconductor layer and the p type semiconductor layer, which could degrade the effect of decreasing the leak current.

Further, the above third to seventh embodiments showed the opto-electronic conversion circuits formed by monolithically integrating the HBT, resistor, or capacitor as an electronic device with the pin type light-receiving device. However, the electronic device does not have to be limited to the HBT, but substantially the same operational effects as in the above third to seventh embodiments can be achieved when the electronic device is an FET or a high electron mobility transistor (HEMT).

Also, the number of pin type light-receiving devices does not have to be limited to one. Namely, substantially the same operational effects as in the above third to seventh embodiments can also be achieved when a plurality of pin type light-receiving devices are monolithically integrated in an array on the semiconductor substrate to form an opto-electronic conversion circuit including the light-receiving device array.

When the light-receiving device array is connected through wire bonding to a package, devices, or IC, bonding pads electrically connected to the light-receiving device array are naturally formed outside the light-receiving device array, whereby the light-receiving device array can be reduced in mechanical damage in carrying out wire bonding. Because of it, though the light-receiving device array is composed of the plurality of pin type light-receiving devices, the packaging yield of light-receiving device array does not show an extreme drop as compared with the pin type light-receiving devices each constructed alone.

Also, the above second, fourth, and sixth embodiments showed examples in which the impurity-diffusing region was formed by diffusing the impurity of the second conduction type from the p type semiconductor layer into the interfacial region of the passivation layer in contact with the p type semiconductor layer, based on the heat applied in growing the passivation semiconductor layer on the surface of the p type semiconductor layer. It is, however, noted that there is no need to limit the method for diffusing the impurity of the second conduction type from the p type semiconductor layer into the interfacial region of the passivation layer in contact with the p type semiconductor layer at all, and another method may be arranged in such a manner that the semiconductor substrate is heated by a resistance heating furnace after the all semiconductor layers are formed.

In addition, the above-mentioned seventh embodiment showed examples in which the pin type light-receiving device in the opto-electronic conversion circuit is formed as the pin type light-receiving device of the first embodiment. However, when the pin type light-receiving device in the opto-electronic conversion circuit is formed as the pin type light-receiving device of the second embodiment, effects substantially similar to those of the seventh embodiment can be obtained as well.

Also, in the seventh embodiment, the equivalent capacitance capacitor in the opto-electronic conversion circuit is formed as an MIM type capacitor. However, when the equivalent capacitance capacitor in the opto-electronic conversion circuit is formed as an MIS (Metal-Insulator-Semiconductor) type capacitor, effects substantially similar to those of the seventh embodiment can be obtained as well.

Further, in the seventh embodiment, the equivalent capacitance capacitor in the opto-electronic conversion circuit is formed as a device which has a capacitance value nearly equal to that of the pin type light-receiving device. However, when a dummy pin type light-receiving device having a configuration identical to that of the pin type light-receiving device is used in place thereof, effects substantially similar to those of the seventh embodiment can be obtained as well.

Now, examples according to the present invention will be explained with reference to FIG. 19 to FIG. 21.

First Example

For the pin type light-receiving device of the above first embodiment, tests were conducted to check suppression of dark current based on formation of the passivation semiconductor layer. Here, prepared as two types of pin type light-receiving devices to be compared were one with the passivation semiconductor layer formed substantially in the same manner as described in the first embodiment and one different from the one as described in the first embodiment only in that no passivation semiconductor was formed.

Figure 19:
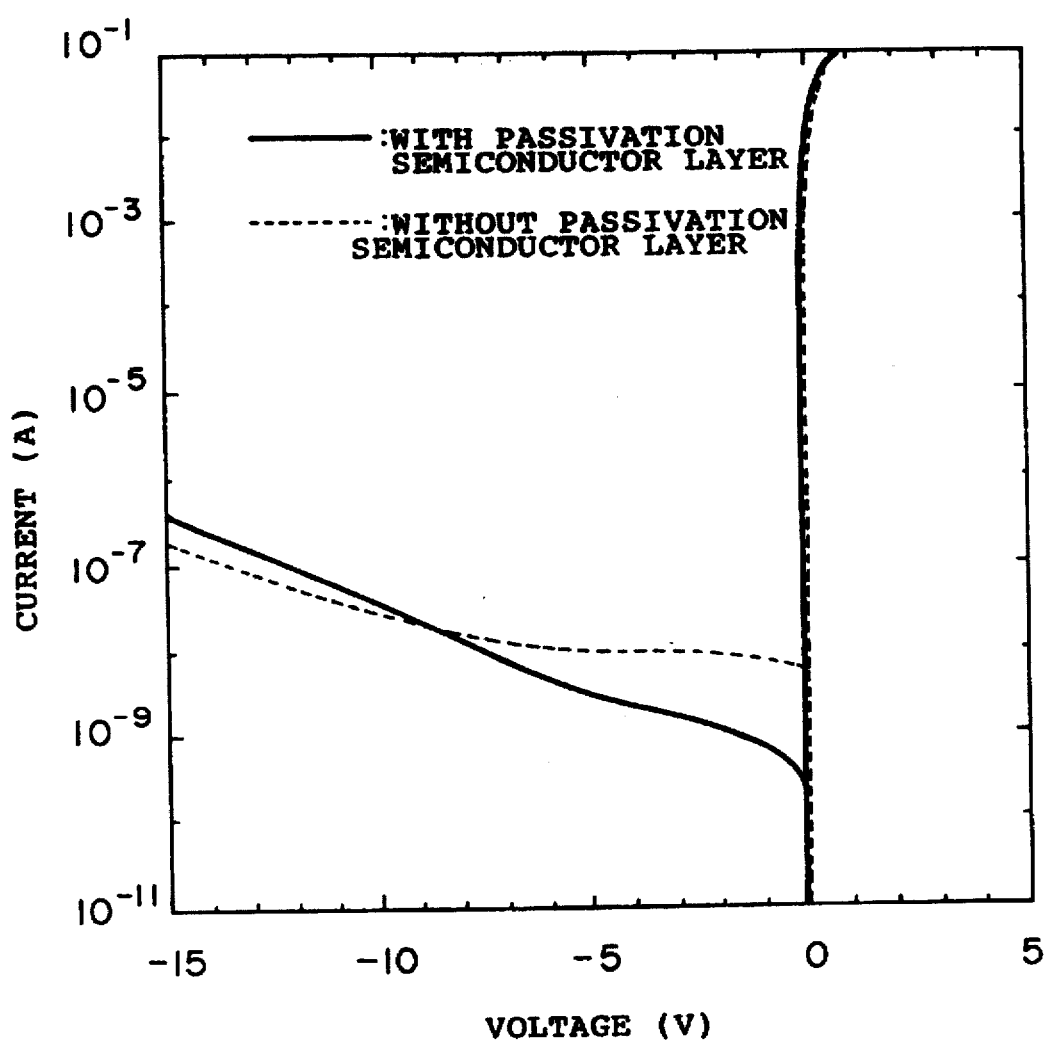
FIG. 19 is a graph to show bias voltage-dark current characteristics depending upon formation of the passivation semiconductor layer in the pin type light-receiving device of FIG. 1.

FIG. 19 shows results of measurements when current-voltage characteristics were measured while these two types of pin type light-receiving devices were placed each in a dark place. In FIG. 19, voltage values of bias voltage are set on the abscissa while current values of dark current on the ordinate. The solid line represents a characteristic curve of the pin type light-receiving device with the passivation semiconductor layer while the dashed line a characteristic curve of the pin type light-receiving device without the passivation semiconductor layer.

As shown in FIG. 19, the level of the dark current occurring in the pin type light-receiving device with the passivation semiconductor layer is extremely lower in the range of low reverse bias voltages than the level of the dark current occurring in the pin type light-receiving device without the passivation semiconductor layer; for example, the reduction rate is about 1/10 for reverse bias voltages near about −2V.

It is thus understood that occurrence of dark current is suppressed in the pin type light-receiving device of the first embodiment, based on formation of the passivation semiconductor layer.

Second Example

For the pin type light-receiving device of the above first embodiment, tests were conducted to check suppression of dark current based on the surface treatment applied to the n type semiconductor layer, i type semiconductor layer, p type semiconductor layer, and passivation semiconductor layer. Here, prepared as three types of pin type light-receiving devices to be compared were one obtained by immersing the surfaces of the various semiconductor layers in the HCl based washing solution substantially in the same manner as described in the first embodiment, one obtained by immersing the surfaces of the various semiconductor layers in the HF based washing solution substantially in the same manner as described in the first embodiment, and one different from the one as described in the first embodiment only in that no surface treatment was conducted.

The conditions of surface treatment were as follows.

(1) The pin type light-receiving device subjected to the surface treatment with the HCl based washing solution Mixing component ratio of the washing solution

| HCl:H$_2$O = 1:10 | (by volume) |
|---|---|
| Treating time | 5 minutes |

(2) The pin type light-receiving device subjected to the surface treatment with the HF based washing solution Mixing component ratio of the washing solution

| HCl:H$_2$O = 1:10 | (by volume) |
|---|---|
| Treating time | 5 minutes |

Figure 20:
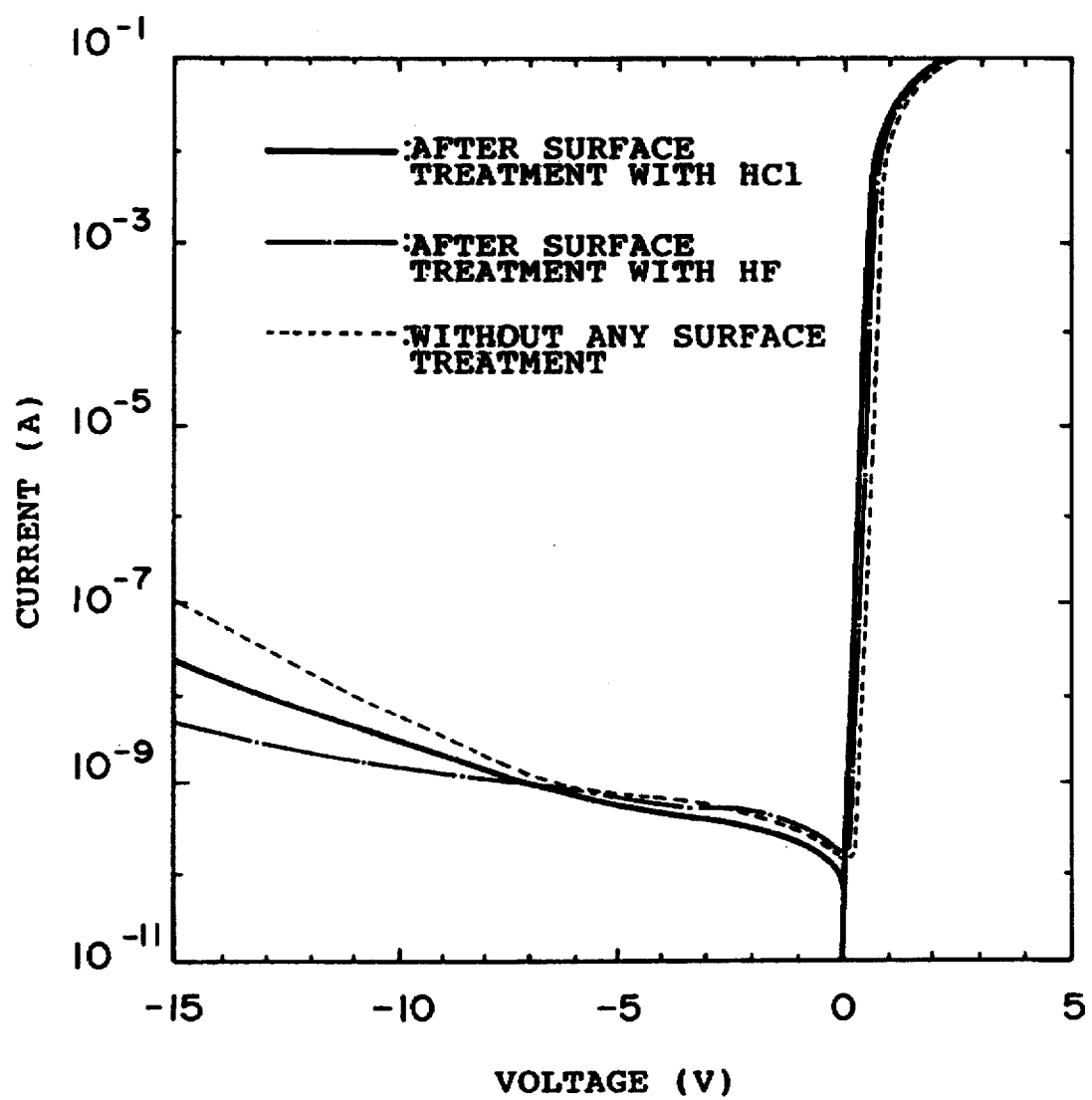
FIG. 20 is a graph to show bias voltage-dark current characteristics depending upon the surface treatment effected on the various semiconductor layers in the pin type light-receiving device of FIG. 1.

FIG. 20 shows results of measurements when current-voltage characteristics were measured while these three types of pin type light-receiving devices were set each in a dark place. In FIG. 20, voltage values of bias voltage are set on the abscissa while current values of dark current on the ordinate. The solid line represents a characteristic curve of the pin type light-receiving device subjected to the surface treatment with the HCl based washing solution, the chain line a characteristic curve of the pin type light-receiving device subjected to the surface treatment with the HF based washing solution, and the dashed line a characteristic curve of the pin type light-receiving device without any surface treatment.

As shown in FIG. 20, the level of dark current occurring in the pin type light-receiving device subjected to the surface treatment with the HCl based washing solution is extremely lower in the range of high reverse bias voltages than the level of dark current occurring in the pin type light-receiving device without any surface treatment; for example, the reduction rate is about 1/5 for reverse bias voltages near about −15V.

Further, the level of dark current occurring in the pin type light-receiving device subjected to the surface treatment with the HF based washing solution is extremely lower in the range of high reverse bias voltages than the level of dark current occurring in the pin type light-receiving device without any surface treatment; for example, the reduction rate is about 1/25 for reverse bias voltages near about −15V.

It is thus understood that occurrence of dark current is suppressed in the pin type light-receiving device of the first embodiment, based on the surface treatment effected on the various semiconductor layers.

Third Example

For the pin type light-receiving device of the above second embodiment, tests were conducted to check suppression of dark current based on the annealing for forming the impurity-diffusing layer in the interfacial regions of the passivation semiconductor layer and i type semiconductor layer in contact with the p type semiconductor layer. Here, prepared as two types of pin type light-receiving devices to be compared were one subjected to annealing effected substantially in the same manner as described in the second embodiment and one different from the one as described in the second embodiment only in that no annealing was effected.

The conditions of annealing were as follows.

| Medium of the atmosphere | N$_2$ gas |
|---|---|
| Treating temperature | 600° C. |
| Treating time | 1 hour |

Figure 21:
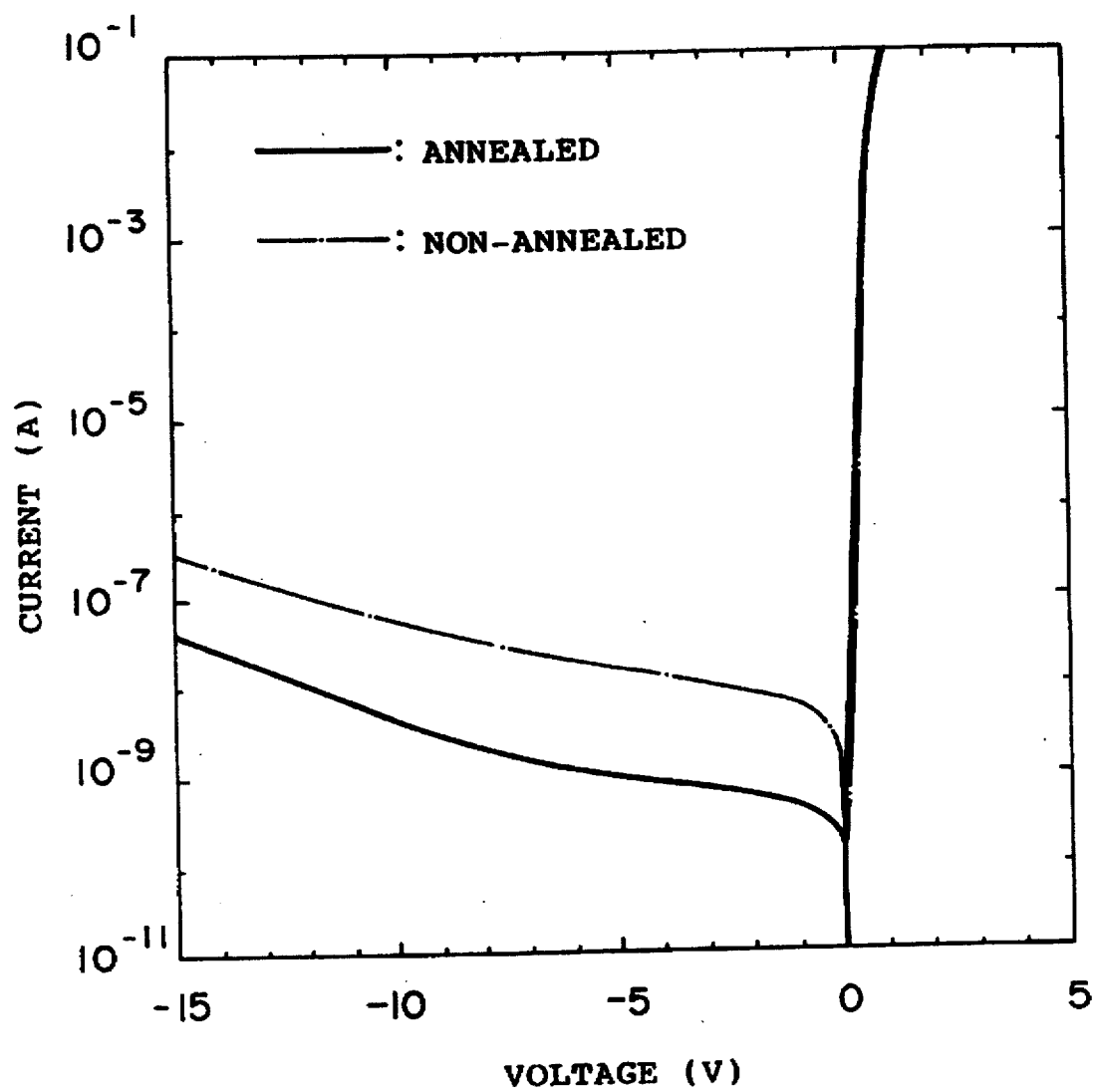
FIG. 21 is a graph to show bias voltage-dark current characteristics depending upon annealing for forming an impurity-diffused layer in the pin type light-receiving device of FIG. 4.

FIG. 21 shows results of measurements when current-voltage characteristics were measured while these two types of pin type light-receiving devices were set each in a dark place. In FIG. 21, voltage values of bias voltage are set on the abscissa while current values of dark current on the ordinate. The solid line represents a characteristic curve of the pin type light-receiving device subjected to the annealing and the dashed line a characteristic curve of the pin type light-receiving device without annealing.

As shown in FIG. 21, the level of dark current occurring in the pin type light-receiving device after annealed is extremely lower in a relatively wide range of reverse bias voltages from the low level to the high level than the level of dark current occurring in the pin type light-receiving device formed without annealing; for example, the reduction rate is 1/10 or less for all levels of reverse bias voltages.

It is thus understood that occurrence of dark current is well suppressed in the pin type light-receiving device of the second embodiment, based on the annealing treatment for forming the impurity-diffusing layer.

As detailed above, in the pin type light-receiving device of the present invention the interface of the pn junction region between the first semiconductor layer and the third semiconductor layer becomes the heterojunction to the fourth semiconductor layer, being the wide band gap semiconductor layer. Because of it, the depletion layer made upon application of the reverse bias voltage does not reach the interface between the fourth semiconductor layer and the insulator layer covering the surface thereof and thus, is not exposed. This results in reducing the leak current flowing along the wall surfaces of the second and third semiconductor layers depending upon the surface state between the fourth semiconductor layer and the insulator layer, thus presenting the effect of improving the device characteristics based on suppression of dark current.

In the fabrication process of the pin type light-receiving device according to the present invention, the fourth semiconductor layer, being the wide band gap semiconductor layer, is formed on the second and third semiconductor layers made of the same semiconductor material. The crystal quality of the fourth semiconductor layer can be maintained relatively good, and the location of the pn junction region is determined based on only the steps for forming the first to third semiconductor layers. Provided accordingly is the effect of perfectly covering the pn junction region by the fourth semiconductor layer.

In the opto-electronic conversion circuit of the present invention, the electronic device is monolithically integrated with the pin type light-receiving device on the semiconductor substrate. This can suppress occurrence of dark current in the pin type light-receiving device, thereby decreasing occurrence of noise in the electronic device. Provided accordingly is the effect of improving the receiving sensitivity of the electronic device to light signals entering the pin type light-receiving device. Also, the opto-electronic conversion circuit is not comprised of separate devices combined each other, but comprised of various devices formed as monolithically integrated. Provided accordingly is the effect of promoting the reduction of packaging area and packaging cost for the opto-electronic conversion circuit.

In the fabrication process of the opto-electronic conversion circuit according to the present invention, the electronic device is monolithically integrated with the pin type light-receiving device formed in the fabrication process of the pin type light-receiving device according to the present invention on the semiconductor substrate. This permits the fourth semiconductor layer to be formed in relatively good crystal quality in the pin type light-receiving device, and the location of the pn junction region depends upon only the steps for forming the first to third semiconductor layers. Provided accordingly is the effect of perfectly covering the pn junction region by the fourth semiconductor layer.

In the opto-electronic conversion module of the present invention, the opto-electronic conversion circuit of the present invention, in which, together with pin type light-receiving device, the equivalent capacitance capacitor and resistor, as the electronic circuit device, are monolithically integrated on the semiconductor substrate, and the first and second amplifiers electrically connected to the opto-electronic conversion circuit are packaged on the conductive substrate. This can reduce leak current at the pin type light-receiving device, thereby decreasing noise generated at the first and second preamplifiers. For this reason, the opto-electronically-converted signal output from the first preamplifier and the noise-compensating signal output from the second preamplifier can be used for eliminating the common mode noise generated due to fluctuations in environmental temperature and bias power supply, for example. Provided accordingly is the effect of greatly improving the opto-electronic conversion characteristics of the opto-electronic conversion circuit for converting light signals entering the pin type light-receiving device into electric signals.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application Nos. 015997/1995 (7-015997) filed on Feb. 2, 1995, and 310755/1995 (7-310755) filed on Nov. 29, 1995, are hereby incorporated by reference.

What is claimed is:

1. A pin type light-receiving device comprising:

a semiconductor substrate;

a first semiconductor layer formed on said semiconductor substrate and doped with an impurity of a first conduction type;

a second semiconductor layer formed in a mesa shape on said first semiconductor layer and made of a first semiconductor material without intentionally doping said first semiconductor material with an impurity;

a third semiconductor layer formed in a mesa shape on said second semiconductor layer and made of said first semiconductor material doped with an impurity of a second conduction type different from said first conduction type;

a first electrode layer formed in ohmic contact on said first semiconductor layer;

a second electrode layer formed in ohmic contact on said third semiconductor layer; and a fourth semiconductor layer formed around said first to third semiconductor layers and made of a second semiconductor material having a band gap energy greater than that of said first semiconductor material, said second semiconductor material being un-intentionally doped with an impurity.

2. The pin type light-receiving device according to claim 1, wherein an interfacial region of said fourth semiconductor layer in contact with said third semiconductor layer is doped with the impurity of said third semiconductor layer by out-diffusing of said impurity into said fourth semiconductor layer.

3. The pin type light-receiving device according to claim 1, wherein said first semiconductor material is GaInAs and said second semiconductor material is InP.

4. The pin type light-receiving device according to claim 1, further comprising an insulator layer formed around said semiconductor substrate and said first to fourth semiconductor layers.

5. An opto-electronic conversion circuit comprising:

a semiconductor substrate;

a pin type light-receiving device formed on said semiconductor substrate; and an electronic device formed as monolithically integrated with said pin type light-receiving device on said semiconductor substrate and electrically connected to said pin type light-receiving device, wherein said pin type light-receiving device comprises a first semiconductor layer formed on said semiconductor substrate and doped with an impurity of a first conduction type, a second semiconductor layer formed in a mesa shape on said first semiconductor layer and made of a first semiconductor material with un-intentionally doped of said first semiconductor material with an impurity, a third semiconductor layer formed in a mesa shape on said second semiconductor layer and made of said first semiconductor material doped with an impurity of a second conduction type different from said first conduction type, a first electrode layer formed in ohmic contact on said first semiconductor layer, a second electrode layer formed in ohmic contact on said third semiconductor layer, and a fourth semiconductor layer formed around said first to third semiconductor layers and made of a second semiconductor material having a band gap energy greater than that of said first semiconductor material, said second semiconductor material being un-intentionally doped with an impurity.

6. The opto-electronic conversion circuit according to claim 5, wherein an interfacial region of said fourth semiconductor layer in contact with said third semiconductor layer is doped with the impurity of said third semiconductor layer by out-diffusing of said impurity into said fourth semiconductor layer.

7. The opto-electronic conversion circuit according to claim 5, further comprising an insulator layer formed around said semiconductor substrate and said first to fourth semiconductor layers.

8. The opto-electronic conversion integrated circuit according to claim 5, wherein said electronic device is a heterojunction bipolar transistor.

9. The opto-electronic conversion circuit according to claim 5, wherein said electronic device comprises a capacitor formed on said semiconductor substrate and a resistor formed through an insulator layer on said semiconductor substrate.

10. An opto-electronic conversion module comprising:

a conductive substrate;

an opto-electronic conversion circuit which is disposed on said conductive substrate and in which a pin type light-receiving device and an electronic circuit device are monolithically integrated so as to be electrically connected to each other;

a first preamplifier which is disposed on said conductive substrate and electrically connected to said pin type light-receiving device; and a second amplifier which has a configuration identical to that of said first preamplifier and is disposed on said conductive substrate while being electrically connected to said electronic circuit device, wherein said opto-electronic conversion circuit comprises a semiconductor substrate on which said pin type light-receiving device and said electronic circuit device are formed, wherein said pin type light-receiving device comprises a first semiconductor layer formed on said semiconductor substrate and doped with an impurity of a first conduction type, a second semiconductor layer formed in a mesa shape on said first semiconductor layer and made of a first semiconductor material without intentionally doping said first Semiconductor material with an impurity, a third semiconductor layer formed in a mesa shape on said second semiconductor layer and made of said first semiconductor material doped with an impurity of a second conduction type different from said first conduction type, a first electrode layer formed in ohmic contact on said first semiconductor layer, a second electrode layer formed in ohmic contact on said third semiconductor layer, and a fourth semiconductor layer formed around said first to third semiconductor layers and made of a second semiconductor material having a band gap energy greater than that of said first semiconductor material, said second semiconductor material being un-intentionally doped with an impurity, wherein said electronic device comprises an equivalent capacitance capacitor directly formed on said semiconductor substrate and having a capacitance value identical to that of said pin type light-receiving device, and a resistor formed through an insulator layer on said semiconductor substrate.

11. The opto-electronic conversion module according to claim 10, wherein an interfacial region of said fourth semiconductor layer in contact with said third semiconductor layer is doped with the impurity of said third semiconductor layer by out-diffusing of said impurity into said fourth semiconductor layer.

12. The opto-electronic conversion module according to claim 10, further comprising an insulator layer formed around said semiconductor substrate and said first to fourth semiconductor layers.

* * * * *